(12) United States Patent
Yokotani et al.

(10) Patent No.: US 11,322,526 B2
(45) Date of Patent: May 3, 2022

(54) DISPLAY DEVICE

(71) Applicant: Japan Display Inc., Tokyo (JP)

(72) Inventors: Yuki Yokotani, Tokyo (JP); Masanobu Ikeda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/161,668

(22) Filed: Jan. 29, 2021

(65) Prior Publication Data
US 2021/0249448 A1 Aug. 12, 2021

(30) Foreign Application Priority Data

Feb. 10, 2020 (JP) .............................. JP2020-020318

(51) Int. Cl.
| | | |
|---|---|---|
| *H01L 27/12* | (2006.01) |
| *H01L 25/16* | (2006.01) |
| *G02F 1/1335* | (2006.01) |
| *G02F 1/1362* | (2006.01) |
| *G09G 3/32* | (2016.01) |
| *G02F 1/1368* | (2006.01) |
| *G02F 1/1343* | (2006.01) |

(52) U.S. Cl.
CPC .... *H01L 27/1248* (2013.01); *G02F 1/136227* (2013.01); *G02F 1/136236* (2021.01); *H01L 25/167* (2013.01); *H01L 27/1288* (2013.01); *G02F 1/13685* (2021.01); *G02F 1/133514* (2013.01); *G02F 1/134363* (2013.01); *G09G 3/32* (2013.01); *H01L 27/1225* (2013.01)

(58) Field of Classification Search
None
See application file for complete search history.

(56) References Cited

U.S. PATENT DOCUMENTS 10,403,799 B1 9/2019 Wu et al.
2021/0210474 A1* 7/2021 Ikeda .................... H01L 27/124

FOREIGN PATENT DOCUMENTS

| JP | 2016-14849 A | 1/2016 |
| JP | 2017-181928 A | 10/2017 |
| JP | 2019-212694 A | 12/2019 |

* cited by examiner

*Primary Examiner* — Richard H Kim
(74) *Attorney, Agent, or Firm* — Xsensus LLP

(57) ABSTRACT

A display device includes a first substrate and a second substrate comprising a color filter film. The first substrate includes a first organic resin layer, a second organic resin layer over the first organic resin layer; and a first opening portion provided by opening the first organic resin layer and the second organic resin layer. The first organic resin layer includes a first opening side surface having a first taper angle greater than 0° and less than 80° in the first opening portion. The second organic resin layer includes a second side surface having a second taper angle greater than 80° and less than 90° in the first opening portion. The first opening side surface is covered with the second organic resin layer.

9 Claims, 23 Drawing Sheets

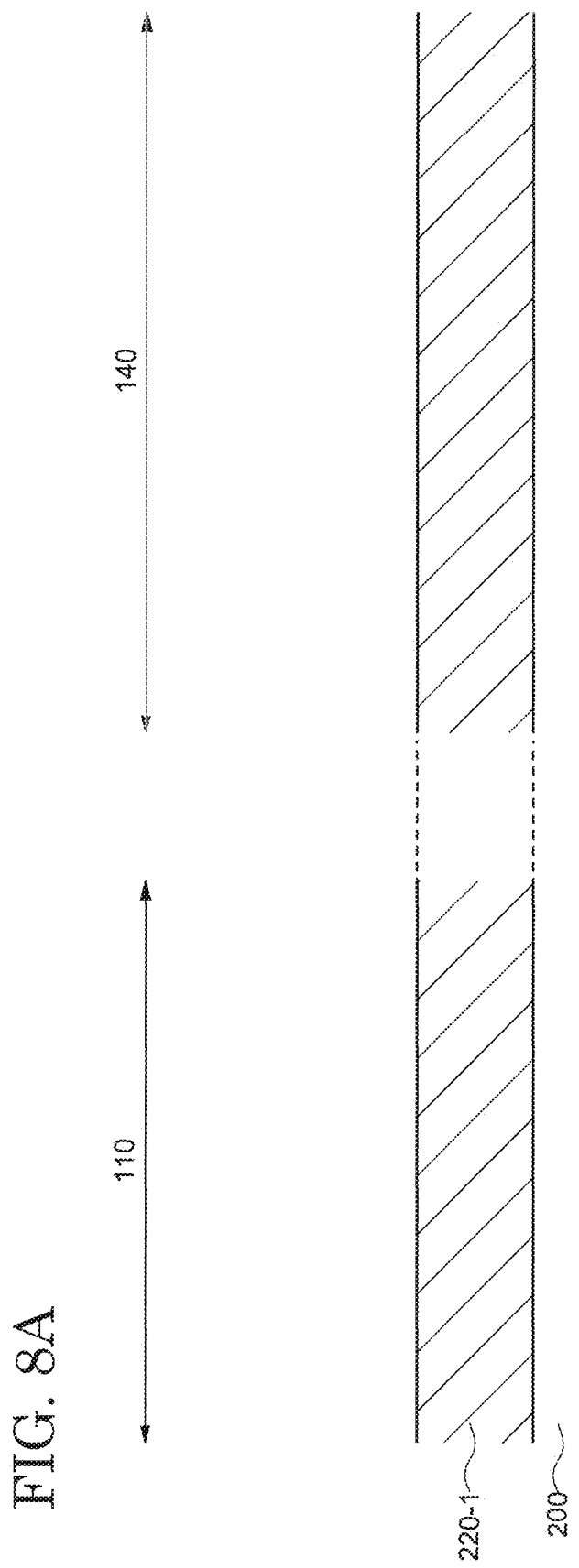

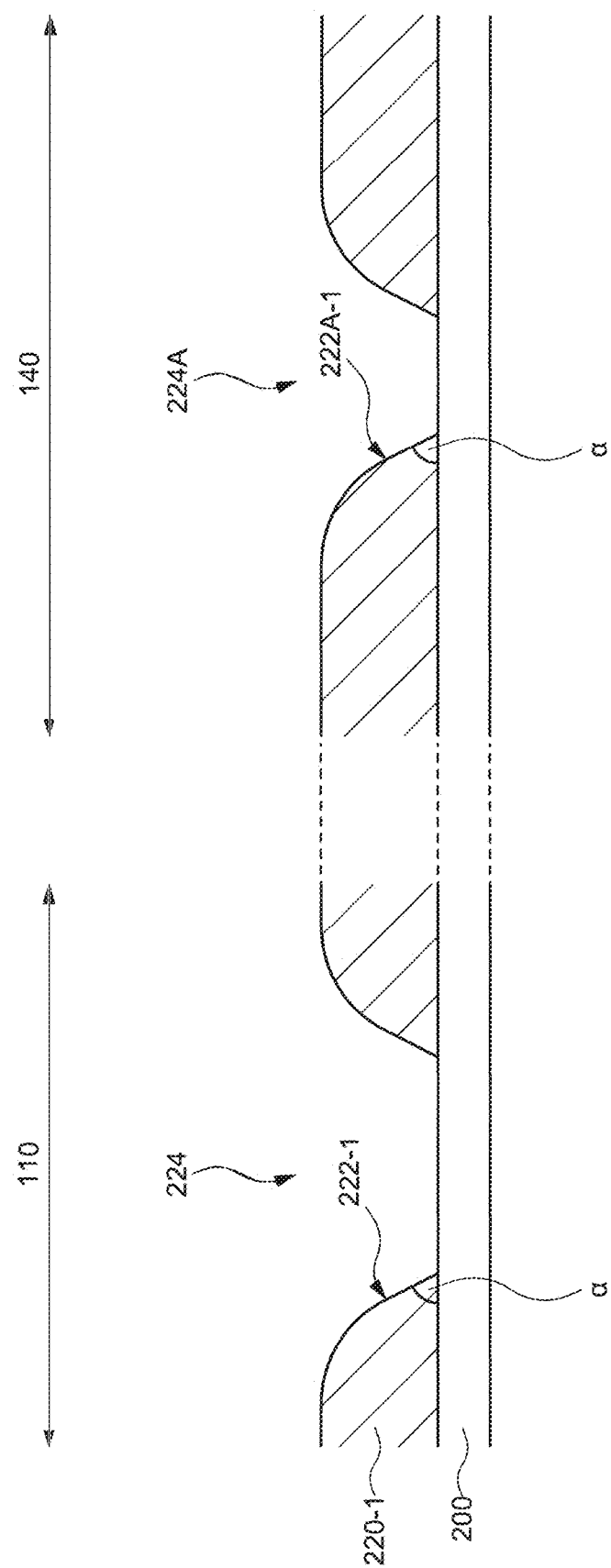

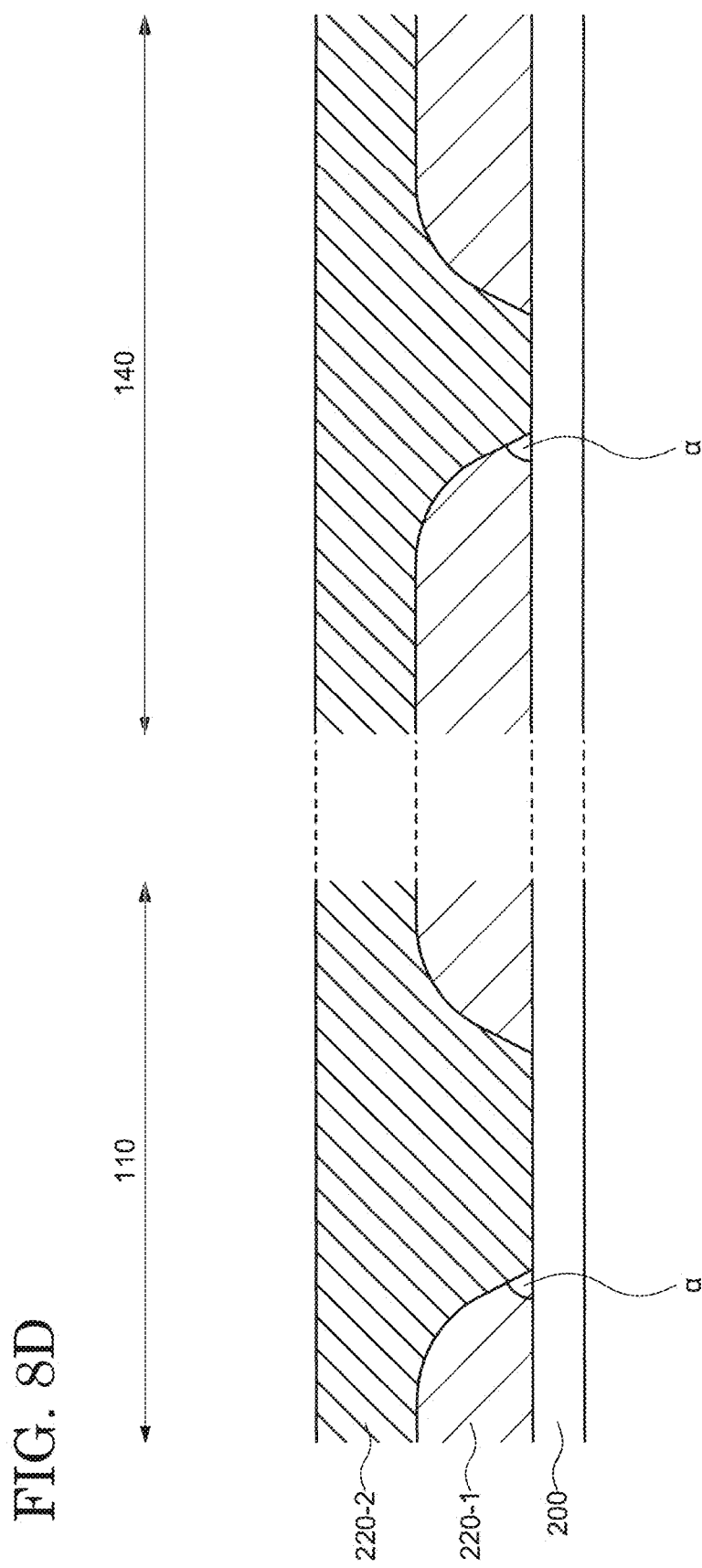

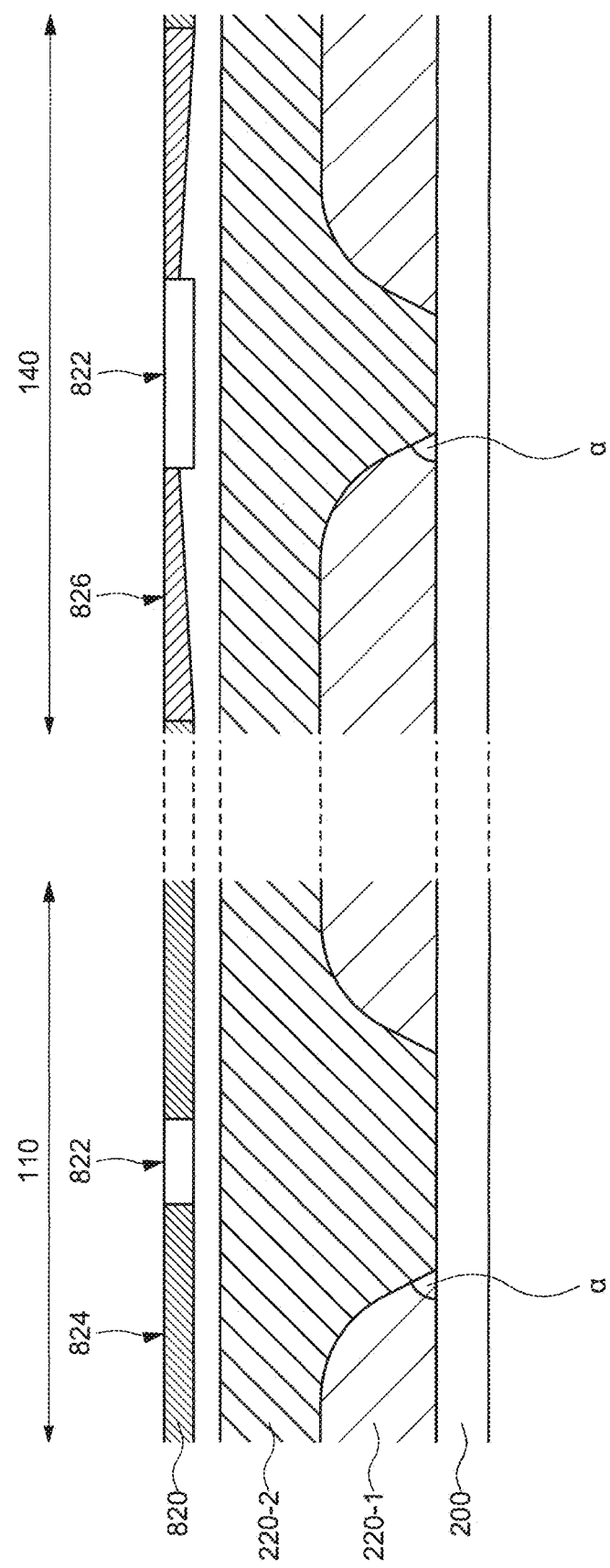

DISPLAY DEVICE

CROSS REFERENCE TO RELATED APPLICATION

This application is based on and claims the benefit of priority from the prior Japanese Patent Application No. 2020-020318, filed on Feb. 10, 2020, the entire contents of which are incorporated herein by reference.

FIELD

An embodiment of the present invention relates to a display device.

BACKGROUND

In recent years, for the purpose of virtual reality (VR) applications, for example, a display device having ultra-high definition exceeding 1000 ppi and high speed drive with a refresh rate exceeding 60 Hz has been developed. In order to realize the display device having ultra-high definition, it is necessary to reduce a pitch between the wirings. However, if the pitch between the wirings is reduced, high-speed driving becomes difficult due to an increase in the load capacitance between the wirings or the electrodes. That is, there is a trade-off between ultra-high definition and high speed drive. Therefore, there is a demand for the design of the display device that reduces the load capacity while reducing the pitch between wirings.

Further, focusing on a light emitting element included in the display device, in recent years, a micro LED display device in which a minute LED chip is arranged in each of a plurality of pixels has been developed. The micro LED display device is a self-luminous display device similar to an organic EL display device, and has excellent visibility. Further, the LED chip has higher luminous efficiency and longer reliability than the organic EL element. Therefore, the micro LED display device is expected as a next-generation display that replaces the organic EL display device.

SUMMARY

A display device according to an embodiment of the present invention includes a first substrate and a second substrate comprising a color filter film. The first substrate includes a first organic resin layer, a second organic resin layer over the first organic resin layer; and a first opening portion provided by opening the first organic resin layer and the second organic resin layer. The first organic resin layer includes a first opening side surface having a first taper angle greater than 0° and less than 80° in the first opening portion. The second organic resin layer includes a second side surface having a second taper angle greater than 80° and less than 90° in the first opening portion. The first opening side surface is covered with the second organic resin layer.

A display device according to an embodiment of the present invention includes a first electrode layer, an LED chip electrically connected to the first electrode layer, a first organic resin layer covering the first electrode layer, and a second organic resin layer over the first organic resin layer. An end portion of the first organic resin layer includes a first convex shape in a vicinity of a side surface of the LED chip. An end portion of the second organic resin layer includes a second convex shape in the vicinity of the side surface of the LED chip. A height of the second convex shape is greater than a height of the first convex shape.

BRIEF DESCRIPTION OF DRAWINGS

FIG. 8A is a schematic view illustrating a method for manufacturing a planarization layer of a display device according to an embodiment of the present invention;

FIG. 8C is a schematic view illustrating a method for manufacturing a planarization layer of a display device according to an embodiment of the present invention;

FIG. 8D is a schematic view illustrating a method for manufacturing a planarization layer of a display device according to an embodiment of the present invention;

FIG. 8E is a schematic view illustrating a method for manufacturing a planarization layer of a display device according to an embodiment of the present invention;

DESCRIPTION OF EMBODIMENTS

Figure 1:
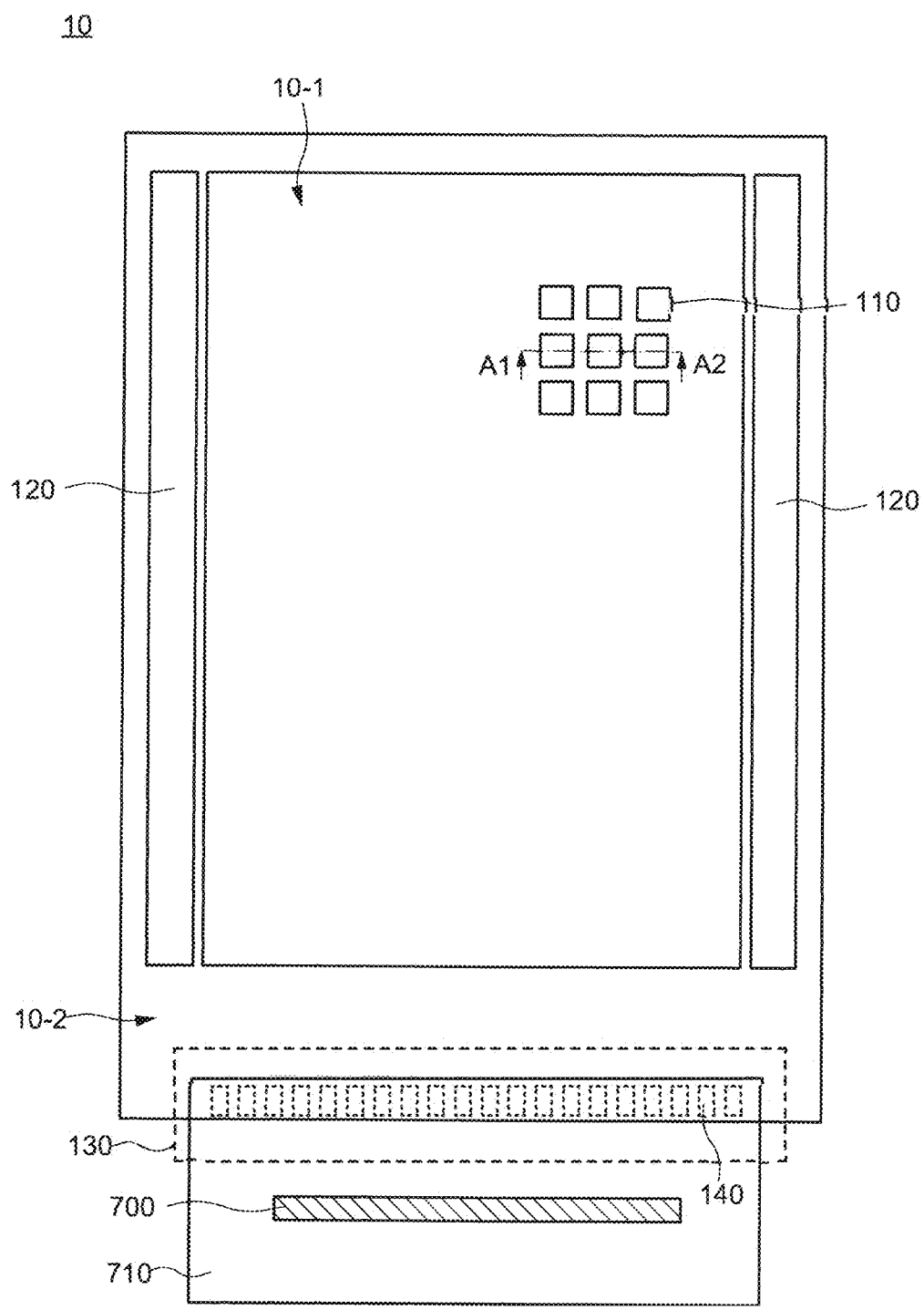
FIG. 1 is a schematic plan view of a display device according to an embodiment of the present invention.

One of the objects of an embodiment of the present invention is to provide a display device having high definition and high speed drive. Further, one of the objects of an embodiment of the present invention is to provide a display device having high reliability.

Each embodiment of the present invention is explained below while referring to the drawings. However, the present invention can be implemented in various modes without departing from the gist of the invention and should not be interpreted as being limited to the description of the embodiments exemplified below.

Although the drawings may be schematically represented in terms of width, thickness, shape, and the like of each part as compared with their actual mode in order to make explanation clearer, it is only an example and an interpretation of the present invention is not limited. In addition, in the drawings, the same reference numerals are provided to the same elements as those described above with reference to preceding figures and repeated explanations may be omitted accordingly.

In the case when a single film is processed to form a plurality of structural bodies, each structural body may have different functions and roles, and the bases formed beneath each structural body may also be different. However, the plurality of structural bodies is derived from films formed in the same layer by the same process and have the same material. Therefore, the plurality of these films is defined as existing in the same layer.

When expressing a mode in which another structure is arranged over a certain structure, in the case where it is simply described as "over", unless otherwise noted, a case where another structure is arranged directly over a certain structure as if in contact with that structure, and a case where another structure is arranged via another structure over a certain structure, are both included.

In each embodiment of the present invention, as a general rule, the direction from the substrate to the structure is described as "over" with reference to the substrate on which the structure is formed, and is also shown. However, in the explanation of the method of manufacturing the structure, since the explanation is based on the order of formation, the vertical relationship may be opposite to that in the drawing. For example, even when the second member is provided over the first member in the drawing, it may be described that the first member is formed over the second member.

First Embodiment

<1. Display Device 10>

Referring to FIGS. 1 to 4, a structure of a display device 10 according to an embodiment of the present invention is described.

FIG. 1 is a schematic plan view of the display device 10 according to the embodiment of the present invention.

As shown in FIG. 1, the display device 10 includes a display region 10-1 and a peripheral region 10-2. The peripheral region 10-2 is located outside the display region 10-1.

Although a boundary between the display region 10-1 and the peripheral region 10-2 is not always clear, the display region 10-1 is a region in which an image or a moving image can be displayed. A shape of the display region 10-1 shown in FIG. 1 is a rectangle having short sides and long sides, but the shape of the display region 10-1 is not limited thereto. The shape of the display region 10-1 may be any shape that corresponds to the size or shape of the display device 10, such as a polygon, a circle, or an ellipse.

The display region 10-1 includes a plurality of pixels 110. The plurality of pixels shown in FIG. 1 are arranged in a matrix. However, the arrangement of the plurality of pixels 110 is not limited thereto. The plurality of pixels may be arranged in a staggered pattern, for example.

The peripheral region 10-2 includes a scanning line drive circuit portion 120 and a terminal portion 130. The scanning line drive circuit portion 120 shown in FIG. 1 is provided along the long side direction of the rectangle of the display region 10-1. However, the position of the scanning line drive circuit portion 120 is not limited thereto. The scanning line drive circuit portion 120 may be provided along the short side direction of the rectangle of the display area 10-1, for example.

The scanning line drive circuit portion 120 shown in FIG. 1 is provided at two locations on the long sides of the rectangle in the display region 10-1, but may be provided at one location on the long side of the rectangle. Further, the scanning line drive circuit unit 120 may be provided on the short side of the rectangle of the display region 10-1.

The display device 10 can supply power or signals from external devices by using the terminal portion 130. Therefore, the terminal portion 130 includes a plurality of terminals 140 that can be electrically connected to the external devices. The plurality of terminals 140 shown in FIG. 1 are electrically connected to the flexible printed circuits (FPCs) 710. Further, a driver IC 700 is provided on the flexible printed circuits 710.

The terminal portion 130 is provided at an end portion of the display device 10. A video signal and a control signal are supplied to the display device 10 from a controller (not shown) provided outside the display device 10 via the flexible printed circuits 710. Further, the video signal and the control signal are converted into signals for the display device 10 via the driver IC 700, and are input to the plurality of pixels 110 and the scanning line drive circuit unit 120, respectively. Further, not only the video signal and the control signal, but also power for driving the scanning line drive circuit portion 120, the driver IC 700, and the plurality of pixels 110 is supplied to the display device 10.

Figure 2:
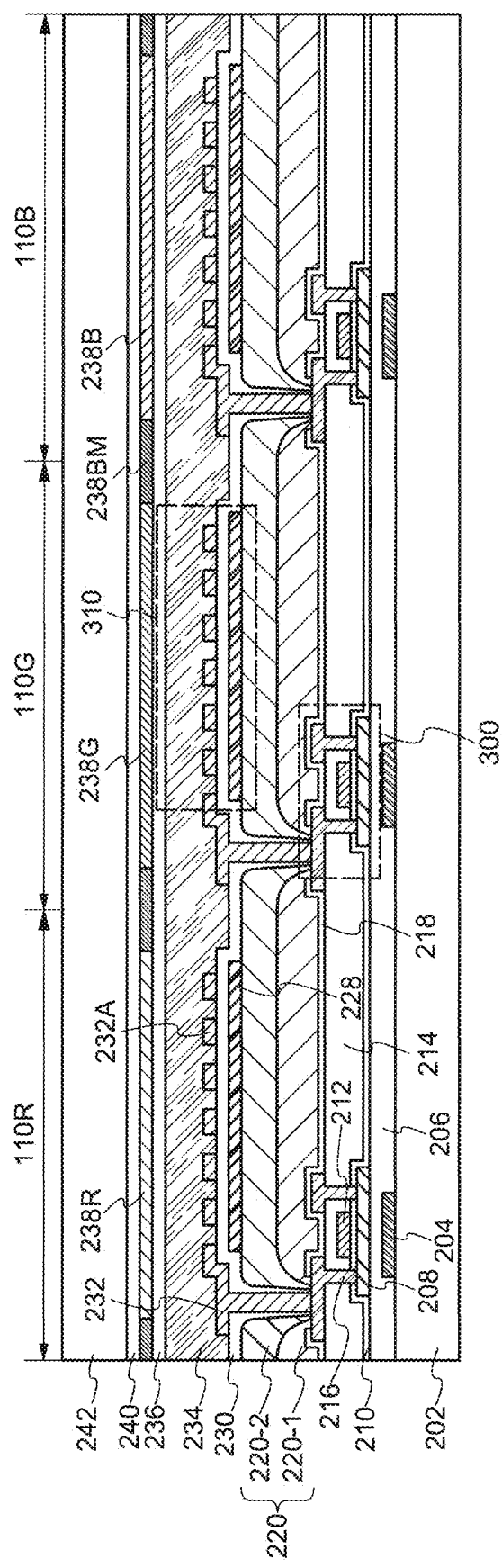
FIG. 2 is a cross-sectional view of a display region of a display device according to an embodiment of the present invention.

FIG. 2 is a cross-sectional view of the display region 10-1 of the display device 10 according to the embodiment of the present invention. Specifically, FIG. 2 is a cross-sectional view of the display region 10-1 taken along a line A1-A2 shown in FIG. 1.

As shown in FIG. 2, the display device 10 includes a first substrate 202, a light-shielding layer 204, a first insulating layer 206, a semiconductor layer 208, a second insulating layer 210, a first conductive layer 212, a third insulating layer 214, and a second conductive layer 216, a fourth insulating layer 218, a first organic resin layer 220-1, a second organic resin layer 220-2, a first electrode layer 228, a fifth insulating layer 230, a second electrode layer 232, a liquid crystal layer 234, a sixth insulating layer 236, a light-shielding film 238BM, a red color filter film 238R, a green color filter film 238G, a blue color filter film 238B, a seventh insulating layer 240, and a second substrate 242.

As the plurality of pixels 110, a red pixel 110R, a green pixel 110G, and a blue pixel 110B are shown in FIG. 2. Each of the red pixel 110R, the green pixel 110G, and the blue pixel 110B includes a transistor 300 that controls the pixel 110.

The transistor 300 is described with reference to FIG. 3.

Figure 3:
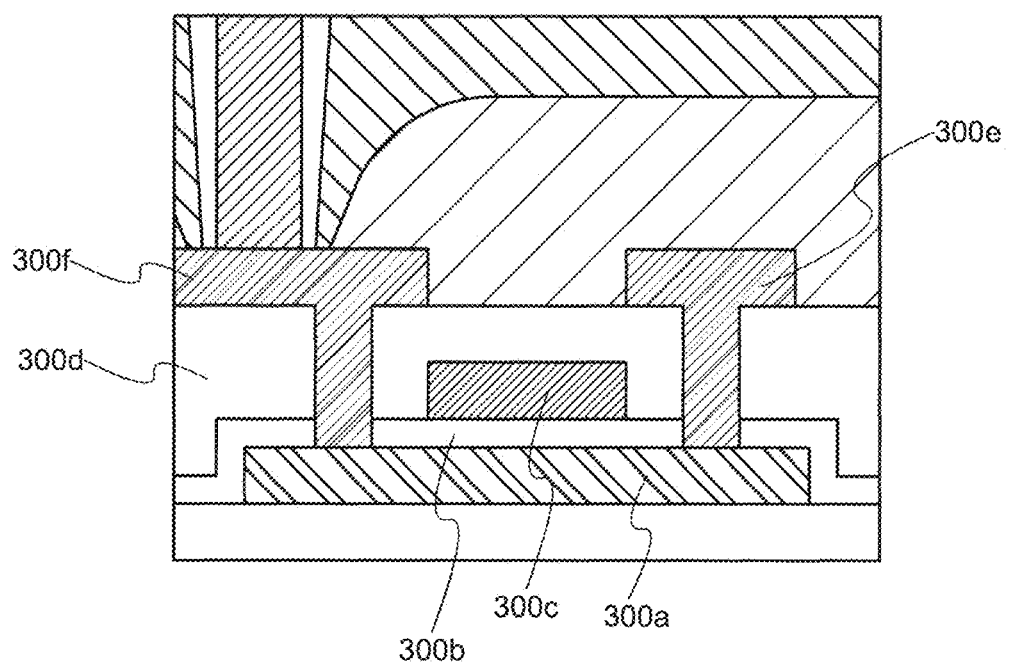
FIG. 3 is a schematic cross-sectional view of a transistor included in a display device according to an embodiment of the present invention.

FIG. 3 is a schematic cross-sectional view of the transistor 300 included in the display device 10 according to the embodiment of the present invention. As shown in FIG. 3, the transistor 300 includes a semiconductor layer 300a, a gate insulating layer 300b, a gate electrode 300c, an interlayer insulating layer 300d, a source electrode 300e, and a drain electrode 300f. The gate insulating layer 300b is provided so as to cover the semiconductor layer 300a. The interlayer insulating layer 300d is provided so as to cover the gate electrode 300c. An opening portion is provided in the gate insulating layer 300b and the interlayer insulating layer 300d. The source electrode 300e and the drain electrode 300f are electrically connected to the semiconductor layer 300a via the opening portion.

The transistor 300 shown in FIG. 3 is a top gate type transistor. In this case, the semiconductor layer 300a, the gate insulating layer 300b, the gate electrode 300c, the interlayer insulating layer 300d, and the source electrode 300e and the drain electrode 300f are formed of the semiconductor layer 208, the second insulating layer 210, the first conductive layer 212, and the first conductive layer 212, the third insulating layer 214, and the second conductive layer 216, respectively. The transistor 300 included in the display device 10 is not limited to the top gate type transistor. A bottom gate type transistor or a dual gate type transistor in which a semiconductor layer is sandwiched between upper and lower gate electrodes can also be used as the transistor 300.

As a material of the semiconductor layer 300a, for example, an amorphous silicon, a polysilicon, an oxide semiconductor such as IGZO, or a compound semiconductor such as gallium nitride can be used. The semiconductor layer 300a can include not only a channel formation region but also a source region or a drain region (high-concentration impurity region). It is also possible to include a low-concentration impurity region between the channel formation region and the source region or drain region.

As a material of the gate insulating layer 300b, for example, silicon oxide, silicon nitride, aluminum oxide, or aluminum nitride can be used. Further, the gate insulating layer 300b can be a single layer or a stacked layer.

As a material of the gate electrode 300c, for example, a metal such as aluminum (Al), titanium (Ti), molybdenum (Mo), copper (Cu), or tungsten (W), or an alloy thereof can be used. Further, the gate electrode 300c can be a single layer or a stacked layer.

As a material of the interlayer insulating layer 300d, for example, silicon oxide, silicon nitride, aluminum oxide, or aluminum nitride can be used. Further, the interlayer insulating layer 300d can be a single layer or a stacked layer.

As a material of the source electrode 300e and the drain electrode 300f, for example, a metal such as aluminum (Al), titanium (Ti), molybdenum (Mo), copper (Cu), or tungsten (W), or an alloy thereof can be used. Further, the source electrode 300e and the drain electrode 300f can be a single layer or a stacked layer. The opening portions are provided in the gate insulating layer 300b and the interlayer insulating layer 300d. The source electrode 300e and the drain electrode 300f are electrically connected to the semiconductor layer 300a through the opening portions provided in the gate insulating layer 300b and the interlayer insulating layer 300d.

Further, a control of the pixel 110 of the display device 10 is described with reference to FIG. 4.

Figure 4:
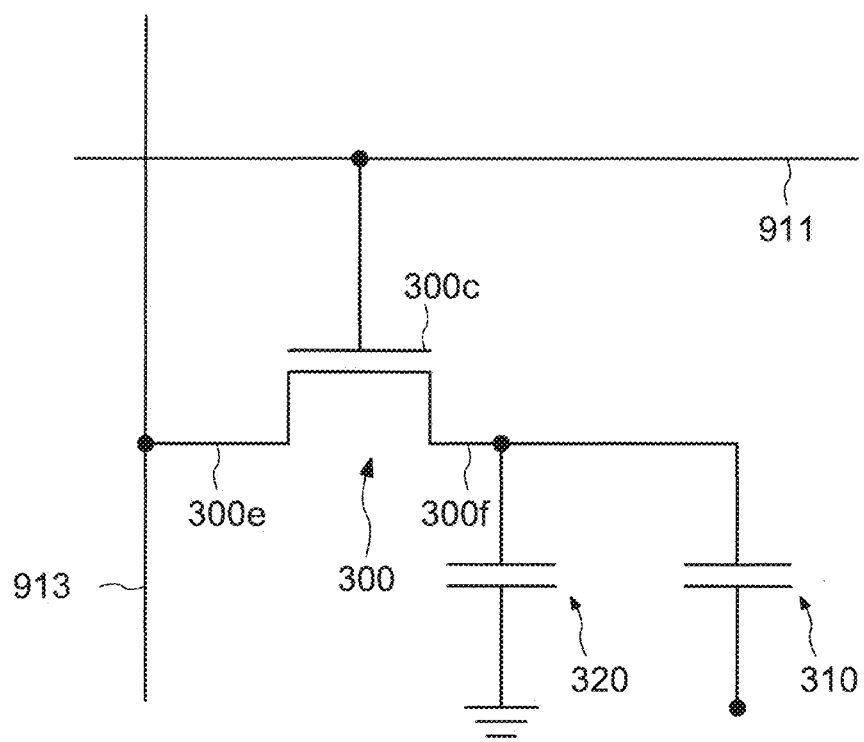
FIG. 4 is a circuit diagram of a pixel circuit in a pixel of a display device according to an embodiment of the present invention.

FIG. 4 is a circuit diagram of a pixel circuit in the pixel 110 of the display device 10 according to the embodiment of the present invention. Each of the plurality of pixels 110 has a pixel circuit shown in FIG. 4. The pixel circuit includes the transistor 300, a gate wiring (scanning line) 911, a source wiring (signal line) 913, a liquid crystal element 310, and a capacitance element 320. The gate electrode 300c of the transistor 300 is electrically connected to the gate wiring 911. The source electrode 300e is electrically connected to the source wiring 913. The drain electrode 300f is electrically connected to the liquid crystal element 310 and the capacitance element 320. In the embodiment, for convenience, reference numerals 300e and 300f are described as source electrodes and drain electrodes, respectively, but the function of the source and the function of the drain in the electrodes may be interchanged.

In the transistor 300, conduction states between the source electrode 300e and the drain electrode 300f are controlled by the signal of the gate wiring 911. Therefore, the on state and the off state of the liquid crystal element 310 of each pixel 110 can be controlled by the transistor 300 provided in each pixel 110. The transistor 300 may be an n-ch transistor or a p-ch transistor.

The capacitance element 320 is provided in parallel with the liquid crystal element 310, and can hold a voltage of the liquid crystal element 310. In FIG. 2, the capacitance element 320 is a capacitance formed between the first electrode layer 228 (common electrode) and the second electrode layer 232 (pixel electrode). Although not shown, the capacitance element 320 can be formed by sandwiching the gate insulating layer 300b between the conductive layer formed in the same process as the source region or drain region of the semiconductor layer 300a and the conductive layer formed in the same process as the gate electrode 300c. Further, the capacitance element 320 can be formed by sandwiching the interlayer insulating layer 300d between the conductive layer formed in the same process as the gate electrode 300c and the conductive layer formed in the same process as the source electrode 300e or the drain electrode 300f.

Returning to FIG. 2, the structure of the display device 10 is described.

The first substrate 202 can function as a support substrate that supports each layer formed over the first substrate 202. As the first substrate 202, for example, a rigid substrate such as a glass substrate, a quartz substrate, and a sapphire substrate can be used. If the first substrate 202 is a transparent substrate, the display region 10-1 of the display device 10 has translucency. Further, as the first substrate 202, for example, a flexible substrate such as a polyimide substrate, an acrylic substrate, a siloxane substrate, or a fluororesin substrate can be used. Impurities may be introduced into the flexible substrate in order to improve the heat resistance of the flexible substrate. When the first substrate 202 does not require translucency, a silicon substrate, a silicon carbide substrate, a semiconductor substrate such as a compound semiconductor substrate, or a conductive substrate such as a stainless steel substrate can be used as the first substrate 202.

The light-shielding layer 204 can shield light incident on the channel-forming region of the semiconductor layer 208. Therefore, the light-shield layer 204 preferably overlap the semiconductor layer 300a of the transistor 300. As a material of the light-shielding layer 204, for example, a metal such as aluminum (Al), titanium (Ti), molybdenum (Mo), copper (Cu), or tungsten (W), or an alloy thereof can be used. Further, the light-shielding layer 204 may be a single layer or a stacked layer.

The first insulating layer 206 can function as an interlayer insulating layer. That is, the semiconductor layer 208 is electrically isolated from the light-shielding layer 204 by the first insulating layer 206. As a material of the first insulating layer 206, for example, silicon oxide, silicon nitride, aluminum oxide, aluminum nitride, or the like can be used. Further, the first insulating layer 206 may be a single layer or stacked layer.

As described above, the semiconductor layer 208, the second insulating layer 210, the first conductive layer 212, the third insulating layer 214, and the second conductive layer 216 can form each layer of the transistor 300. Further, the first conductive layer 212 and the second conductive layer 216 can also form a part of the gate wiring 911 and the source wiring 913, respectively. Furthermore, the second insulating layer 210 or the third insulating layer 214 may be a dielectric material of the capacitance element 320. The semiconductor layer 208, the second insulating layer 210, the first conductive layer 212, the third insulating layer 214, and the second conductive layer 216 can use the same materials as the semiconductor layer 300a, the gate insulating layer 300b, the gate electrode 300c, and the interlayer insulating layer 300d, and the source electrode 300e and the drain electrode 300f, respectively.

The fourth insulating layer 218 can function as a protective layer for the transistor 300. As a material of the fourth insulating layer 218, for example, silicon oxide, silicon nitride, aluminum oxide, aluminum nitride, or the like can be used. Further, the fourth insulating layer 218 can be a single layer or a stacked layer.

The first organic resin layer 220-1 and the second organic resin layer 220-2 are so-called planarization layers 220 having a stacked structure. That is, the first organic resin layer 220-1 and the second organic resin layer 220-2 can cover the transistor 300 and planarize structural steps of the transistor 300. As materials of the first organic resin layer 220-1 and the second organic resin layer 220-2, for example, a photosensitive organic material such as photosensitive acrylic or photosensitive polyimide can be used.

In the embodiment, the second organic resin layer 220-2 having properties different from those of the first organic resin layer 220-1 is provided on the first organic resin layer 220-1. The stacked structure of the first organic resin layer 220-1 and the second organic layer 220-2 can have excellent functions as the planarization layer 220. Details of the stacked structure of the first organic resin layer 220-1 and the second organic resin layer 220-2 and their functions are described later.

The first electrode layer 228 can function as a common electrode for driving the liquid crystal of the liquid crystal element 310. As a material of the first electrode layer 228, for example, a transparent conductive oxide such as indium tin oxide (ITO) or indium zinc oxide (IZO) can be used.

The fifth insulating layer 230 can function as an interlayer insulating layer. That is, the second electrode layer 232 is electrically isolated from the first electrode layer 228 by the fifth insulating layer 230. Further, the fifth insulating layer 230 can function as a protective layer for the planarization layer 220. Furthermore, the fifth insulating layer 230 can function as a capacitive insulating film between the first electrode layer 228 and the second electrode layer 232 of the capacitance element 320

The second electrode layer 232 can function as a pixel electrode for driving the liquid crystal of the liquid crystal element 310. As a material of the second electrode layer 232, a transparent conductive oxide such as indium tin oxide (ITO) or indium zinc oxide (IZO) can be used. The second electrode layer 232 is formed in a comb-teeth shape as shown by reference numeral 232A in a region which overlaps the first electrode layer 228.

An opening portion is provided in the first organic resin layer 220-1, the second organic resin layer 220-2, and the fifth insulating layer 230. In FIG. 2, the fifth insulating layer 230 is provided on a side surface of the opening portion. The fifth insulating layer 230 preferably covers the side surface of the opening portion. However, the fifth insulating layer 230 may not be provided on the side surface of the opening portion. The second electrode layer 232 is electrically connected to the second conductive layer 216 through the opening portion provided in the first organic resin layer 220-1, the second organic resin layer 220-2, and the fifth insulating layer 230.

The liquid crystal layer 234 includes a liquid crystal. As a material of the liquid crystal, an organic polymer material having an orientation such as a nematic phase, a smectic phase, a cholesteric phase, or a discotic phase can be used. Further, the liquid crystal layer 234 can include an alignment film for orienting the liquid crystal. The alignment film is formed on the second electrode layer 232. As a material of the alignment film, for example, polyimide or the like can be used.

The liquid crystal element 310 shown in FIG. 2 is a so-called transverse electric field drive system in which a voltage is applied to the liquid crystal layer 234 by using the first electrode layer 228 and the second electrode layer 232. In FIG. 2, the first electrode layer 228 and the second electrode layer 232 are formed in different layers with the fifth insulating layer 230 interposed therebetween. However, the first electrode layer 228 and the second electrode layer 232 may be formed in the same layer. Even in this case, the liquid crystal element 310 is a transverse electric field drive system. Further, the liquid crystal element 310 may be configured such that the liquid crystal layer 234 is sandwiched between the first electrode layer 228 and the second electrode layer 232. In this case, the liquid crystal element 310 is driven by a vertical electric field drive system. In the display device 10 of the embodiment, either the transverse electric field drive system or the vertical electric field drive system can be applied to the liquid crystal element 310.

The sixth insulating layer 236 can function as a protective film that protects the light-shielding film 238BM, the red color filter film 238R, the green color filter film 238G, and the blue color filter film 238B. As a material of the sixth insulating layer 236, for example, silicon oxide, silicon nitride, aluminum oxide, aluminum nitride, photosensitive acrylic, or the like can be used. Further, the sixth insulating layer 236 may be a single layer or a stacked layer.

The light-shielding film 238BM is, for example, a black matrix. The light-shielding film 238BM can separate the pixels 110 and make the region between the pixels non-translucent. That is, the red pixel 110R, the green pixel 110G, and the blue pixel 110B are separated by the light-shielding film 238BM. As a material of the light-shielding film 238BM, for example, an organic material containing light-shielding fine particles such as a carbon, a metal oxide, an inorganic pigment, or an organic pigment can be used.

The red color filter film 238R, the green color filter film 238G, and the blue color filter film 238B are provided in the red pixel 110R, the green pixel 110G, and the blue pixel 110B, respectively. Further, the green color filter film 238G and the blue color filter film 238B are separated by the light-shielding film 238BM. However, the green color filter film 238G or the blue color filter film 238B may overlap the light-shielding film 238BM. As materials for the red color filter film 238R, the green color filter film 238G, and the blue color filter film 238B, red color resist, green color resist, and blue color resist can be used, respectively.

The seventh insulating layer 240 can function as a protective film for preventing deterioration of the color resist. As a material of the seventh insulating layer 240, for example, silicon oxide, silicon nitride, aluminum oxide, aluminum nitride, or the like can be used. Further, the seventh insulating layer 240 may be a single layer or a stacked layer.

The second substrate 242 can support each layer formed over the second substrate 242. Further, as a material of the second substrate 242, the same material as that of the first substrate 202 can be used.

Although not shown, the display device 10 can further include components of a typical liquid crystal display device such as a polarizing plate or a backlight.

<2. Planarization Layer 220 of Pixel 110>

Figure 5A:
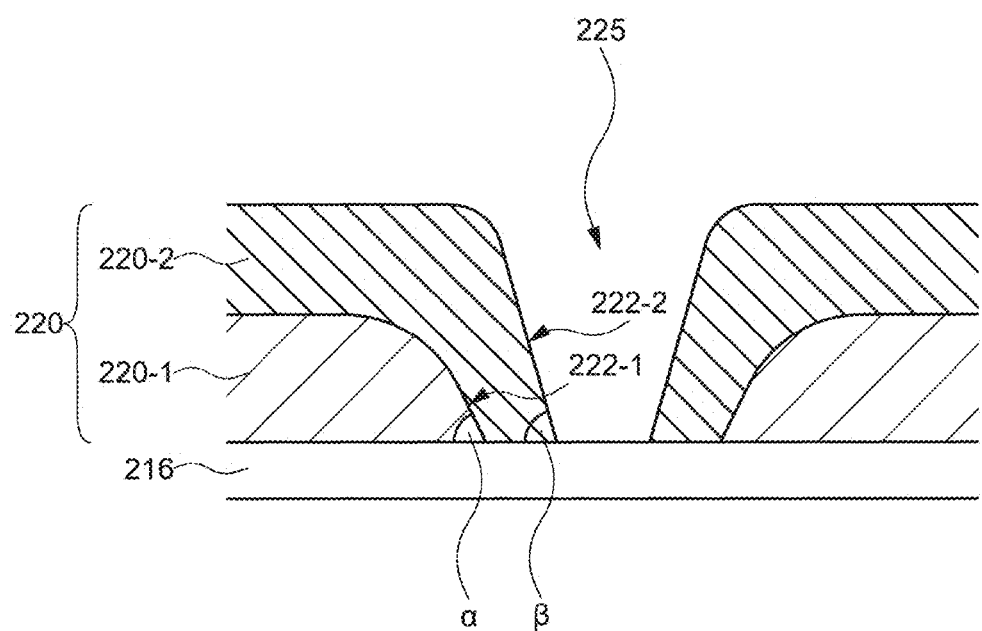
FIG. 5A is a schematic cross-sectional view of a planarization layer having a stacked structure in a pixel of a display device according to an embodiment of the present invention.
Figure 5B:
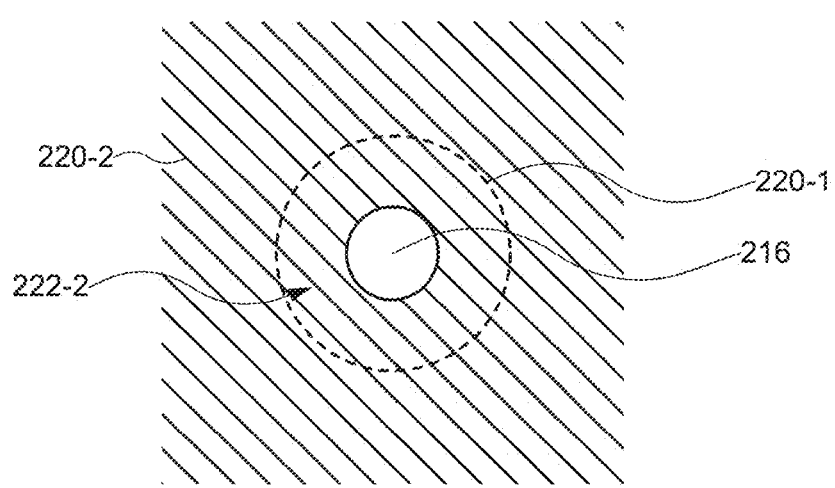
FIG. 5B is a schematic plan view of a planarization layer having a stacked structure in a pixel of a display device according to an embodiment of the present invention.

Referring to FIGS. 5A and 5B, a structure of the planarization layer 220 having the stacked structure of the first organic resin layer 220-1 and the second organic resin layer 220-2 applied to the pixel 110 are described.

FIGS. 5A and 5B are a schematic cross-sectional view and a schematic view of a planarization layer having a stacked structure in a pixel of a display device according to an embodiment of the present invention, respectively.

As shown in FIG. 5A, the planarization layer 220 of the pixel 110 includes the first organic resin layer 220-1 and the second organic resin layer 220-2. The first organic resin layer 220-1 is provided on the second conductive layer 216. Further, the second organic resin layer 220-2 is provided on the first organic resin layer 220-1. The planarization layer 220 shown in FIG. 5A is provided on the second conductive layer 216 for convenience of explanation. However, the planarization layer 220 of the pixel 110 can be provided on a layer other than the second conductive layer 216.

Since the planarization layer 220 is formed separately of the first organic resin layer 220-1 and the second organic resin layer 220-2, the planarization layer 220 can have both properties of the first organic resin layer 220-1 and the second organic resin layer 220-2. For example, a relative dielectric constant of the flattening layer 220 can be adjusted so that a first relative dielectric constant of the first organic resin layer 220-1 is smaller than a second relative dielectric constant of the second organic resin layer 220-2. Further, a refractive index of the planarization layer 220 can be adjusted so that a first refractive index of the first organic resin layer 220-1 is smaller than a second refractive index of the second organic resin layer 220-2. Further, a light transmittance of the planarization layer 220 can be adjusted so that a first light transmittance of the first organic resin layer 220-1 is smaller than a second light transmittance of the second organic resin layer 220-2. The relative dielectric constant, the refractive index, and the light transmittance may be larger in the second organic resin layer 220-2 than in the first organic resin layer 220-1.

When a thermal stability of the first organic resin layer 220-1 is low, a heat resistance of the planarization layer 220 can be improved by covering the first organic resin layer 220-1 with the second organic resin layer 220-2 having high thermal stability. Further, when a photostability of the first organic resin layer 220-1 is low, the planarization layer 220 can be improved by covering the first organic resin layer 220-1 with the second organic resin layer 220-2 having high photostability.

In the pixel 110, a film thickness of the planarization layer 220 is, for example, greater than or equal to 1 µm and less than or equal to 5 µm, preferably greater than or equal to 2 µm and less than or equal to 4 µm.

A film thickness of each of the first organic resin layer 220-1 and the second organic resin layer 220-2 can be determined according to the properties or functions required by the display device 10. For example, when the second relative dielectric constant of the second organic resin layer 220-2 is larger than the first relative dielectric constant of the first organic resin layer 220-1, the film thickness of the second organic resin layer 220-2 can be smaller than the film thickness of the first organic resin layer 220-1. Typically, the ratio of the film thickness of the second organic resin layer 220-2 to the film thickness of the first organic resin layer 220-1 is greater than or equal to 0.2 and less than or equal to 1.0.

Further, a taper angle of a opening portion provided in the planarization layer 220 can also be adjusted while maintaining the above-mentioned properties of the planarization layer 220. In the following, an adjustment of the taper angle of the opening portion, which is one of the features of the planarization layer 220, is described.

As shown in FIGS. 5A and 5B, the planarization layer 220 includes an opening portion 225 provided by opening the first organic resin layer 220-1 and the second organic resin layer 220-2. Specifically, in the opening portion 225, an opening provided in the first organic resin layer 220-1 is covered with the second organic resin layer 220-2. Further, in the opening portion 225, the second organic resin layer 220-2 is also provided with an opening that overlaps with the opening provided in the first organic resin layer 220-1. In the following, for convenience, the opening portion 225 may include not only the opening of the second organic resin layer 220-2 but also the opening of the first organic resin layer 220-1.

A cross-sectional shape of the opening 225 shown in FIG. 5B is a circular. However, the cross-sectional shape of the opening 225 is not limited thereto. The cross-sectional shape of the opening 225 may be an ellipse, a polygon including a rectangle, or the like.

The opening of the first organic resin layer 220-1 includes a first opening side surface 222-1. Further, the opening of the second organic resin layer 220-2 includes a second opening side surface 222-2. In the opening portion 225, the first opening side surface 222-1 is covered with the second opening side surface 222-2. The second opening side surface 222-2 covers the first opening side surface 222-1, so that when the second organic resin layer 220-2 is reflowed, it is possible to prevent the first organic resin layer 220-1 from being dissolved and flowing out to the opening portion 225.

An angle of the first opening side surface 222-1 of the first organic resin layer 220-1 with respect to the surface of the second conductive layer 216 is defined as a first taper angle α. Similarly, an angle of the second opening side surface 222-2 of the second organic resin layer 220-2 with respect to the surface of the second conductive layer 216 is defined as a second taper angle β. The first taper angle α is greater than 0° and less than 80°, and the second taper angle β is 80° or more and less than 90°. That is, the second taper angle β is larger than the first taper angle α. The taper angle of the opening portion of the planarization layer 220 is determined by the second taper angle β. When the second taper angle β becomes larger, an area in the electrical connection of a wiring through the opening portion of the planarization layer 220 can be reduced. That is, since a pitch between wirings is reduced, it is possible to increase the definition of the display device 10.

When the relative dielectric constant of the photosensitive organic material is large, the workability is excellent and the taper angle can be increased. Therefore, in order for the second taper angle β to be larger than the first taper angle α, each of the photosensitive organic materials is preferably selected so that the second relative dielectric constant of the second organic resin layer 220-2 is larger than the first relative dielectric constant of the first organic resin layer 220-1. For example, the first relative dielectric constant of the first organic resin layer 220-1 is greater than or equal to 2.0 and less than 3.5, and the second relative dielectric constant of the second organic resin layer 220-2 is greater than or equal to 3.5 and less than 5.0.

As described above, in the display device 10 according to the present embodiment, the planarization layer 220 of the pixel 110 has a stacked structure in which the second organic resin layer 220-2 is provided on the first organic resin layer 220-1. In the planarization layer 220, the second organic resin layer 220-2 having excellent workability is stacked on the first organic resin layer 220-1 having excellent properties. Therefore, the opening portion 225 of the planarization layer 220 can be controlled by the second organic resin layer 220-2 having excellent workability, and the pitch between wirings can be reduced. Further, since the first organic resin layer having the first relative dielectric constant lower than the second relative dielectric constant of the second organic resin layer is provided, the relative dielectric constant of the planarization layer 220 is lowered, and the load capacity can be reduced. Therefore, the display device 10 having high definition and high speed drive can be provided.

<3. Planarization Layer 220 of Terminal 140>

The planarization layer 220 having the stacked structure using the first organic resin layer 220-1 and the second organic resin layer 220-2 can be applied not only to the pixels 110 of the display portion 10-1 but also to the terminals 140 in the peripheral portion 10-2. Therefore, with reference to FIGS. 6 to 7B, a structure of a planarization layer 220A having a stacked structure using the first organic resin layer 220-1 and the second organic resin layer 220-2 applied to the terminal 140 is described.

Figure 6:
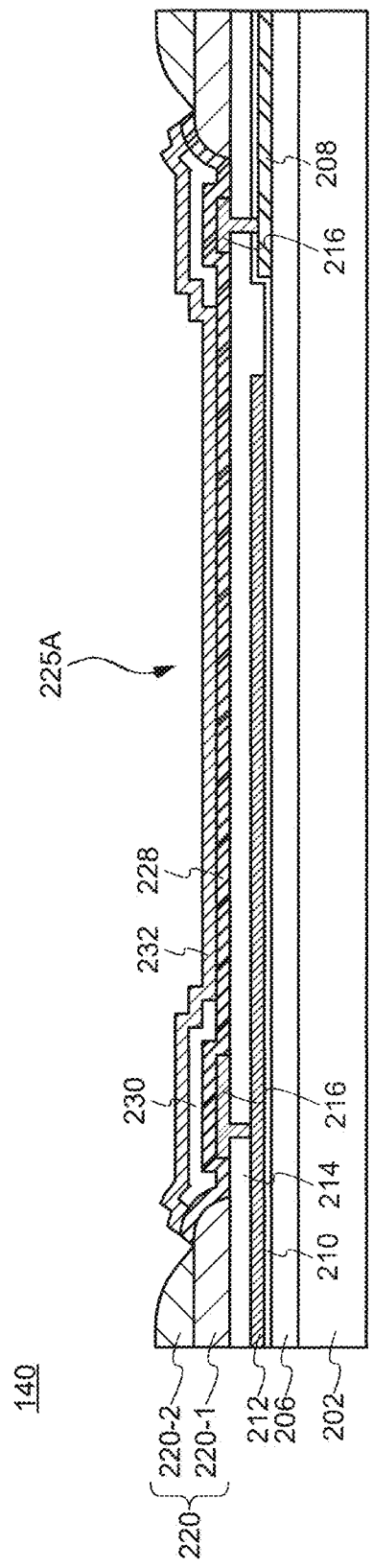
FIG. 6 is a cross-sectional view of a terminal of a display device according to an embodiment of the present invention.

FIG. 6 is a cross-sectional view of the terminal 140 of the display device 10 according to the embodiment of the present invention.

As shown in FIG. 6, the terminal 140 includes the first substrate 202, the first insulating layer 206, the semiconductor layer 208, the second insulating layer 210, the first conductive layer 212, the third insulating layer 214, and the second conductive layer 216, the first organic resin layer 220-1, the second organic resin layer 220-2, the first electrode layer 228, the fifth insulating layer 230, and the second electrode layer 232.

In the terminal 140, an opening portion 225A is provided in the planarization layer 220. Further, the first electrode layer 228 and a second electrode layer 232 are provided in the opening portion 225A. The first electrode layer 228 and the second electrode layer 232 are electrically connected to each other and can function as an electrode of the terminal 140. In the terminal 140, the first electrode layer 228 and the second electrode layer 232 are connected to the two second conductive layers 216. One of the two second conductive layers 216 is connected to the first conductive layer 212, which is drawn toward the display portion 10-1. The other of the two second conductive layers 216 is connected to the semiconductor layer 208, which is drawn toward the end portion of the first substrate 202.

Figure 7A:
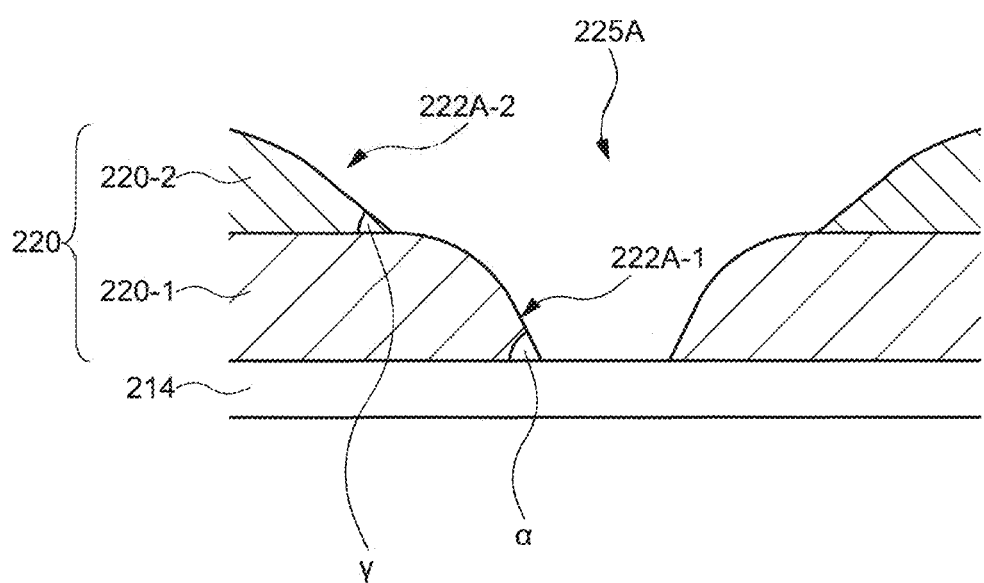
FIG. 7A is a schematic cross-sectional view of a planarization layer having a stacked structure in a terminal of a display device according to an embodiment of the present invention.
Figure 7B:
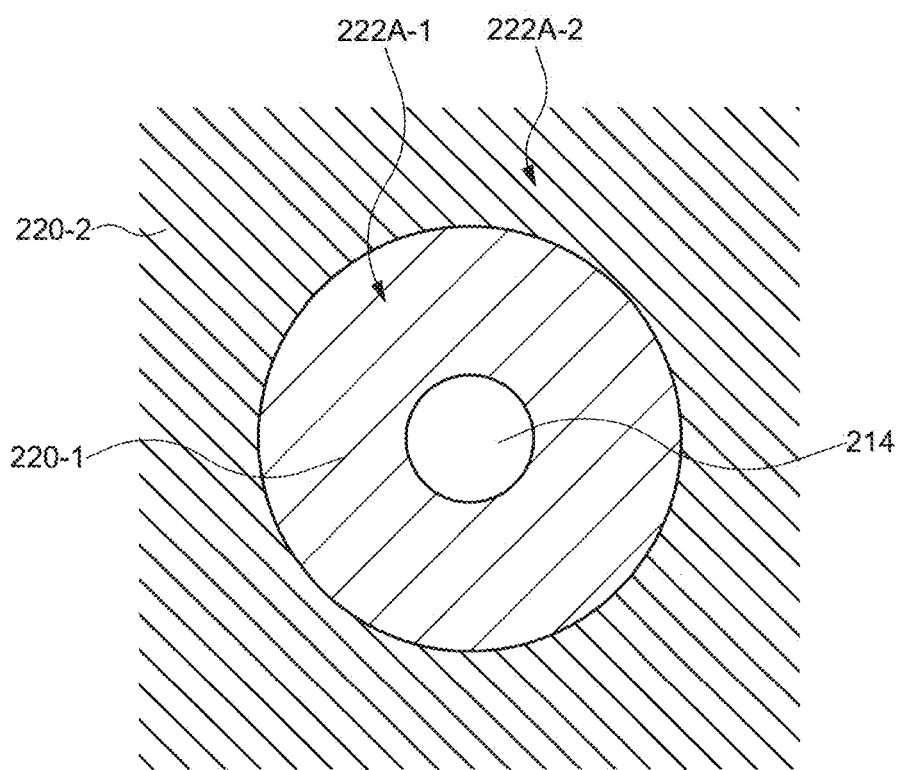
FIG. 7B is a schematic plan view of a planarization layer having a stacked structure in a terminal of a display device according to an embodiment of the present invention.

Referring to FIGS. 7A and 7B, the planarization layer 220 of the terminal 140 is schematically described.

FIGS. 7A and 7B are a schematic cross-sectional view and a plan view of a planarization layer having a stacked structure in a terminal of a display device according to an embodiment of the present invention, respectively.

As shown in FIGS. 7A and 7B, the planarization layer 220 of the terminal 140 includes the first organic resin layer 220-1 and a second organic resin layer 220-2. The first organic resin layer 220-1 is provided on the third insulating layer 214. Further, the second organic resin layer 220-2 is provided on the first organic resin layer 220-1. The planarization layer 220 shown in FIG. 7A is provided on the third insulating layer 214 for convenience of explanation. However, the planarization layer 220 of the terminal 140 can be provided on a layer other than the third insulating layer 214.

As shown in FIGS. 7A and 7B, the planarization layer 220 includes the opening portion 225A provided by opening the first organic resin layer 220-1 and the second organic resin layer 220-2. The opening 225A is a combination of an opening provided in the first organic resin layer 220-1 and an opening provided in the second organic resin layer 220-2. The opening of the first organic resin layer 220-1 and the opening of the second organic resin layer 220-2 are completely overlapped with each other.

The opening of the first organic resin layer 220-1 includes a first opening side surface 222A-1. Further, the opening of the second organic resin layer 220-2 includes a third opening side surface 222A-3. A lower end portion of the first opening side surface 222A-1 is in contact with the third insulating layer 214. On the other hand, a lower end portion of the third opening side surface 222A-3 is on the first organic resin layer 220-1 and is in contact with the first organic resin layer 220-1.

An angle of the first opening side surface 222-1 of the first organic resin layer 220-1 with respect to the surface of the third insulating layer 214 is defined as the first taper angle α. Further, an angle of the third opening side surface 222A-3 with respect to the surface of the first organic resin layer 220-1 is defined as a third taper angle γ. Each of the first taper angle α and the third taper angle γ is larger than 0° and less than 80°. However, the third taper angle γ is preferably smaller than the first taper angle α. As described above, the first electrode layer 228 and the second electrode layer 232 is provided in the opening portion 225A. By reducing the step on the side surface of the opening portion 225A, the first electrode layer 228 and the second electrode layer 232 formed on the side surface of the opening 225A can be etched. As a result, it is possible to prevent a etching residue of the first electrode layer 228 and the second electrode layer 232. Further, since the step on the side surface of the opening portion 225A is small, pressure is likely to be applied to the ACF at the time of the FPCs crimp connection to the opening portion 225A.

As described above, in the display device 10 according to the present embodiment, the planarization layer 220 of the terminal 140 has a stacked structure in which the second organic resin layer 220-2 is provided on the first organic resin layer 220-1. In the planarization layer 220, the second organic resin layer 220-2 having excellent workability is stacked on the first organic resin layer 220-1 having excellent properties. Therefore, in the opening portion 225A of the planarization layer 220, the adhesion of the electrodes of the terminals 140 can be improves by controlling the third taper angle γ of the second organic resin layer 220-2, which has excellent workability, to be small. Further, the terminal 140 can be easily electrically connected to the external devices.

Second Embodiment

Referring to FIGS. 8A to 8F, a method for manufacturing the planarization 220 of the display device 10 according to an embodiment of the present invention is described.

FIGS. 8A to 8F are schematic views illustrating a method for manufacturing the planarization layer 220 of the display device 10 according to an embodiment of the present invention. Specifically, FIGS. 8A to 8F shows the planarization layer 220 formed in the pixel 110 and the terminal 140 of the display device 10. For convenience of explanation, in FIGS. 8A to 8F, the planarization layer 220 is described as being formed on the substrate 200.

First, a photosensitive organic material such as photosensitive acrylic or photosensitive polyimide is coated on the substrate 200 and is heated at higher than or equal to 200° C. and lower than or equal to 250° C. to form the first organic resin layer 220-1 (FIG. 8A). The photosensitive organic material can be coated by using spin coating, inkjet, slit coating or the like. Further, the photosensitive organic material may be a positive type or a negative type. In the following, the photosensitive organic material is described as being a positive type.

Figure 8B:
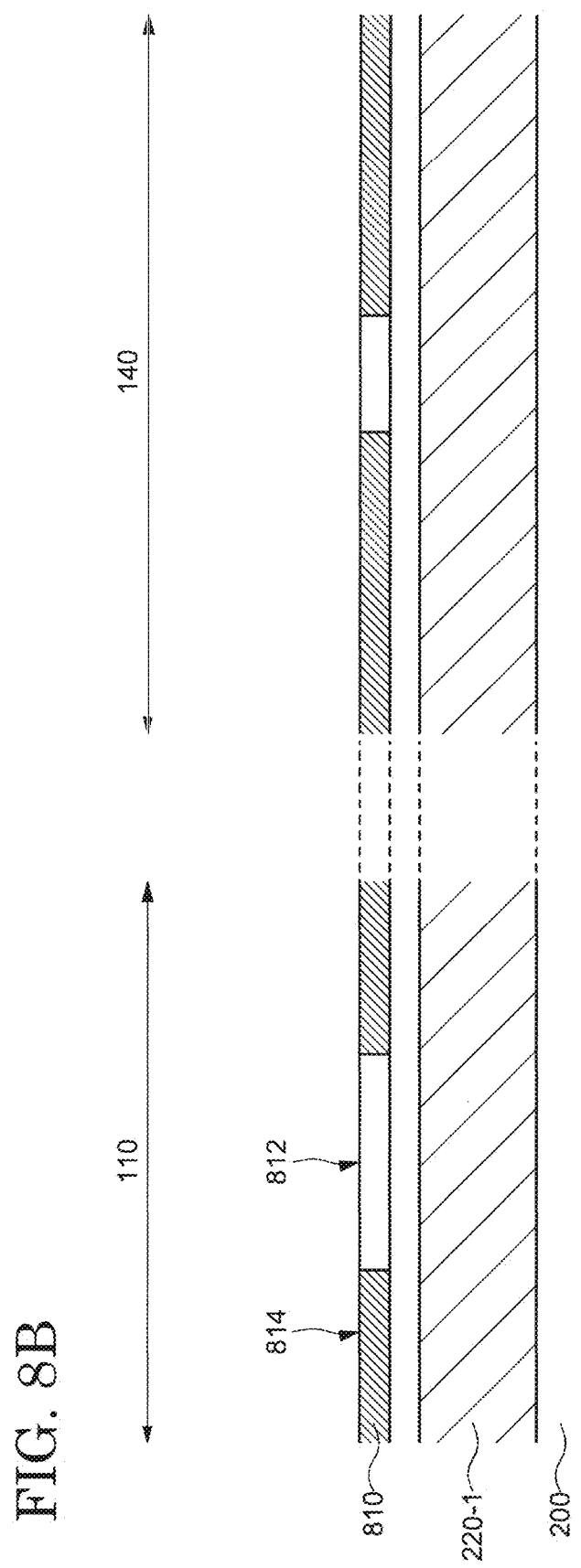
FIG. 8B is a schematic view illustrating a method for manufacturing a planarization layer of a display device according to an embodiment of the present invention.

Next, the first organic resin layer 220-1 is exposed using a mask 810 (FIG. 8B). The mask 810 includes a transmission portion 812 and a light shielding portion 814. The irradiation light from an exposure machine passes through the transmitting portion 812, but does not pass through the light-shielding portion 814. Therefore, a region of the first organic resin layer 220-1 that overlaps the transmission portion 812 of the mask 810 is exposed.

Next, when the first organic resin layer 220-1 is developed, an opening 224 and an opening 224A are formed in the exposed region (FIG. 8C). In the development of the first organic resin layer 220-1, side etching is performed in the vicinity of the exposed region, so that the first opening side surface 222-1 having the first taper angle α is formed in the opening 224 of the first organic resin layer 220-1. Similarly, the first opening side surface 222A-1 having the first taper angle α is formed in the opening 224A. The first organic resin layer 220-1 is a material that is easily dissolved in the developing solution, and the first taper angle α is larger than 0° and less than 80°.

Further, the first organic resin layer 220-1 may be reflowed at higher than or equal to 200° C. and lower than or equal to 250° C.

Next, a photosensitive organic material different from that of the first organic resin layer 220-1 is coated on the first organic resin layer 220-1 and is heated at higher than or equal to 210° C. and lower than or equal to 260° C. to form the second organic resin layer 220-2 (FIG. 8D).

Next, the second organic resin layer 220-2 is exposed using the mask 820 (FIG. 8E). The mask 820 includes a transmission portion 822, a light-shielding portion 824, and a semi-transmission portion 826. That is, the mask 820 is a so-called halftone mask. The irradiation light from the exposure machine is transmitted not only through the transmission portion 822 but also through the semi-transmission portion 826. However, an intensity of the light transmitted through the semi-transmission portion 826 is smaller than an intensity of the light transmitted through the transmission portion 822. Therefore, in the second organic resin layer 220-2, a region overlapping the semi-transmission portion 826 of the mask 820 has a smaller exposure amount than a region overlapping the transmission portion 822.

Further, it is preferable that the light transmittance is changed in the semitransmission portion 826 of the mask 820. By changing the light transmittance, the exposure amount is finely adjusted, so that a taper angle of the photosensitive organic material can be made smaller. For example, the light transmittance of the semi-transmission portion 826 can be adjusted by changing a film thickness of the semi-transmission portion 826, as shown in FIG. 8E. Further, the light transmittance of the semi-transmissive portion 826 can also be adjusted by changing a concentration of a material contained in the semi-transmission portion 826.

Further, in FIG. 8E, the halftone mask is shown as the mask 820, but other multi-tone masks, for example, a gray tone mask can also be used.

Figure 8F:
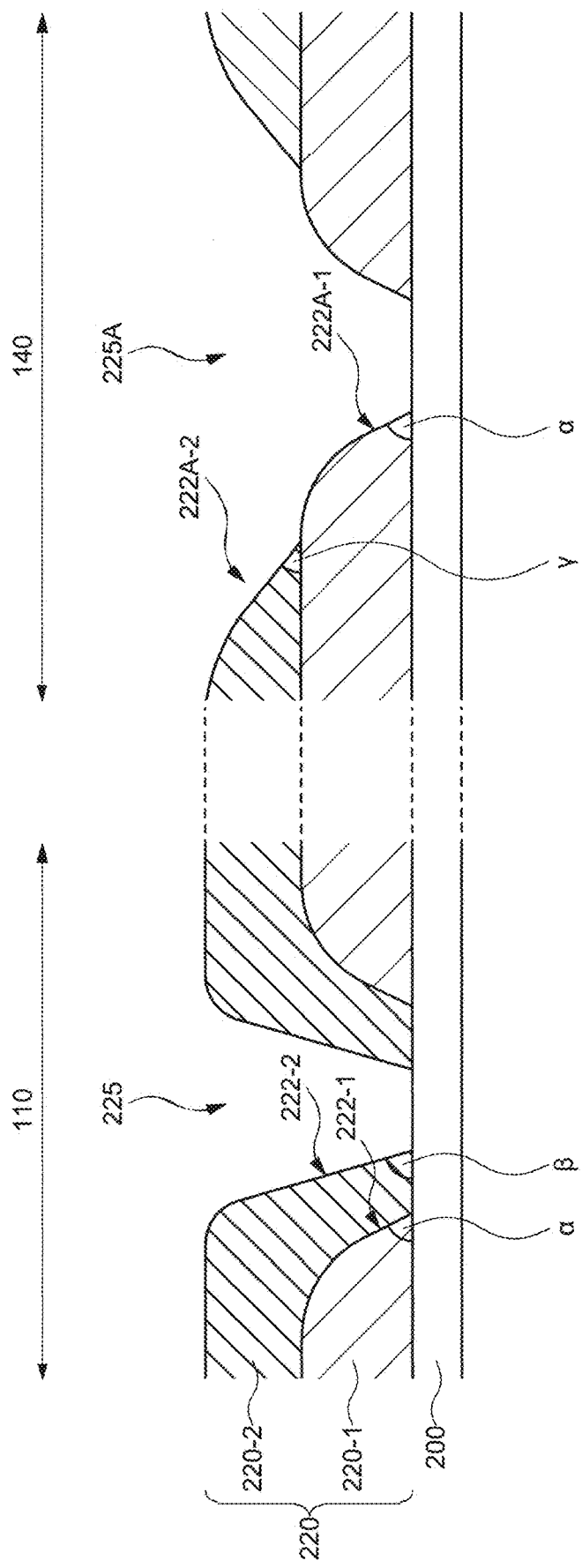
FIG. 8F is a schematic view illustrating a method for manufacturing a planarization layer of a display device according to an embodiment of the present invention.

Next, when the second organic resin layer 220-2 is developed, an opening 225 and an opening 225A are formed in the exposed region (FIG. 8F). In the development of the second organic resin layer 220-2, side etching is performed in the vicinity of the exposed region of the pixel 110, so that the second opening side surface 222-2 having the second taper angle β is formed in the opening 225 of the second organic resin layer220-2. The second organic resin layer 220-2 is a material that is difficult to dissolve in the developing solution, and the second taper angle β is greater than or equal to 80° and less than 90°.

On the other hand, in the exposed region of the terminal 140, not only a region overlapping the transmission portion 812 but also a region overlapping on the semi-transmission portion 816 is exposed. Further, since the region overlapping the semi-transmission portion 816 has a smaller exposure amount than the region overlapping the transmission portion 812, the region overlapping the semi-transmission portion 816 is less likely to be developed than the region overlapping the transmission portion 812. Therefore, in the opening 225A of the second organic resin layer 220-2, the third opening side surface 222-3 having the third taper angle γ is formed. Since the third taper angle γ can be adjusted by the semitransmission portion 816 of the mask 820, it may be smaller or larger than the first taper angle α. However, the first electrode layer 228 and the second electrode layer 232 are provided in the opening 225A. Therefore, in order to enable etching of the first electrode layer 228 and the second electrode layer 232 on the side surface of the opening 225A, it is preferable to reduce the step on the side surface of the opening 225A. That is, the third taper angle γ is preferably smaller than the first taper angle α.

As described above, according to the method for manufacturing the planarization layer 220 of the display device 10 according to the embodiment, the opening portion 225 of the pixel 110 and the opening portion 225A of the terminal 140 having different structures can be formed at the same time. Specifically, the opening portion 225 having the second opening side surface 222-2 with the large second taper angle β is formed in the pixel 110. Further, the opening portion 225 having the first opening side surface 222-1 with the first taper angle α and the third opening side surface 222-3 with the third taper angle γ is formed in the terminal 140. If taper angles are merely different, they can be formed by using a multi-gradation mask. However, in the planarization layer 220 of the display device 10 according to the present embodiment, the properties of the planarization layer 220 can also be taken into consideration. In the case of a planarization layer composed of only the second organic resin layer 220-2 having a large relative dielectric constant, the planarization layer in which an opening having a large taper angle for increasing the definition in the pixel 110 and an opening having a small taper angle in the terminal 140 can be formed by using a multi-gradation mask. However, since this planarization layer has a large relative dielectric constant, a load capacity is large and the display device cannot be driven at high speed. On the other hand, by including the first organic resin layer 220-1 having a small relative dielectric constant in the planarization layer 220, the relative dielectric constant of the planarization layer 220 becomes small, and the display device 10 can be driven at high speed. In addition, as described above, since the pixel 110 has the opening portion 225 having the large second taper angle β, the display device 10 can have high definition.

Therefore, according to the method for manufacturing the planarization layer 220 of the display device 10 according to the present embodiment, the planarization layer 220 having excellent structure, properties, and functions can be manufactured, so that the display device 10 having excellent performance, for example, having high definition and high speed can be manufactured.

Third Embodiment

Figure 9:
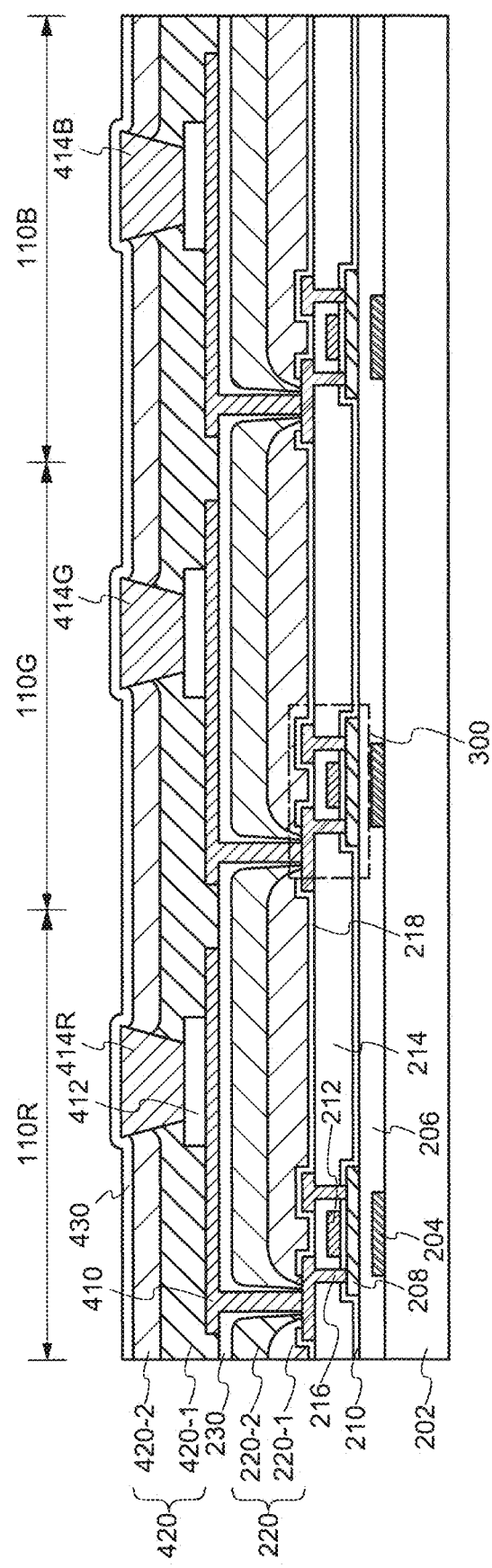
FIG. 9 is a cross-sectional view of a display region of a display device according to an embodiment of the present invention.
Figure 10A:
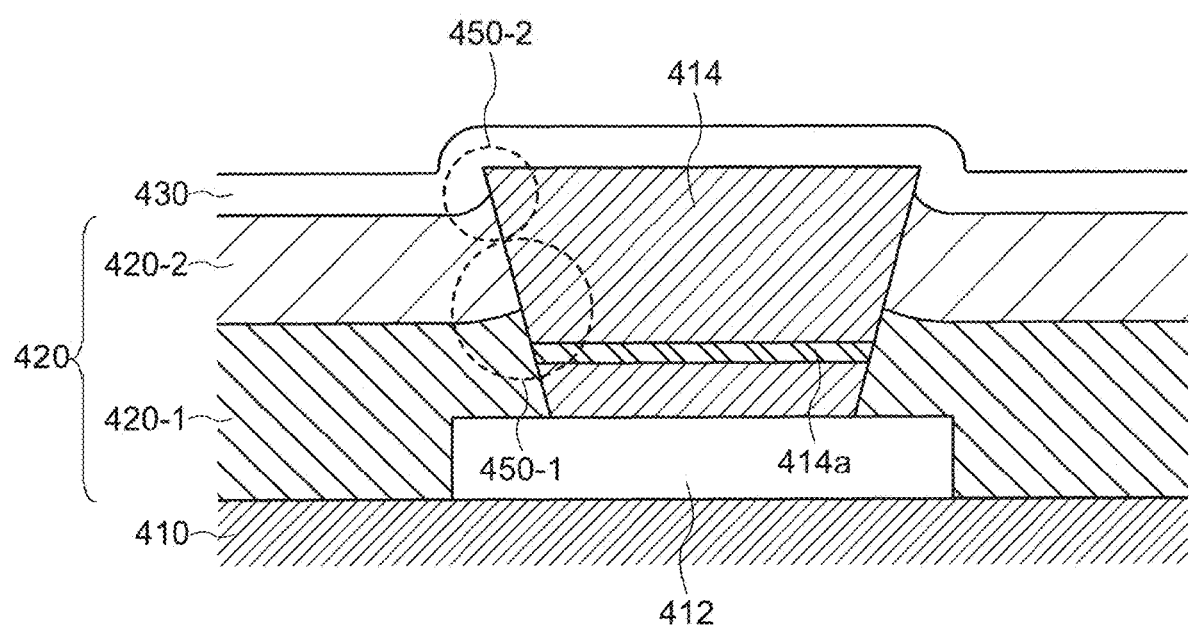
FIG. 10A is an enlarged view of a region in which an LED chip is mounted in a display device according to an embodiment of the present invention.
Figure 10B:
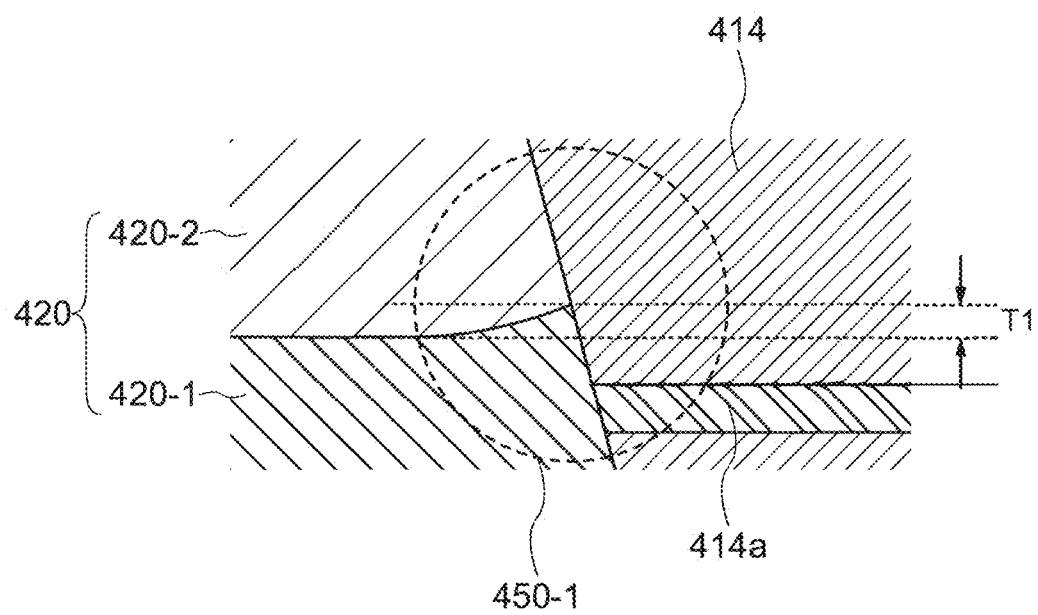
FIG. 10B is an enlarged view of a vicinity of an end portion of a third organic resin layer in a display device according to an embodiment of the present invention.
Figure 10C:
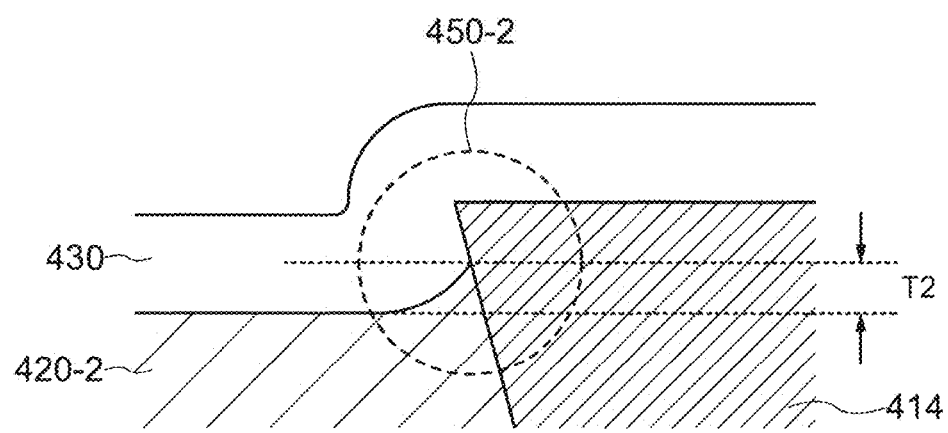
FIG. 10C is an enlarged view of a vicinity of an end portion of a fourth organic resin layer in a display device according to an embodiment of the present invention.
Figure 11:
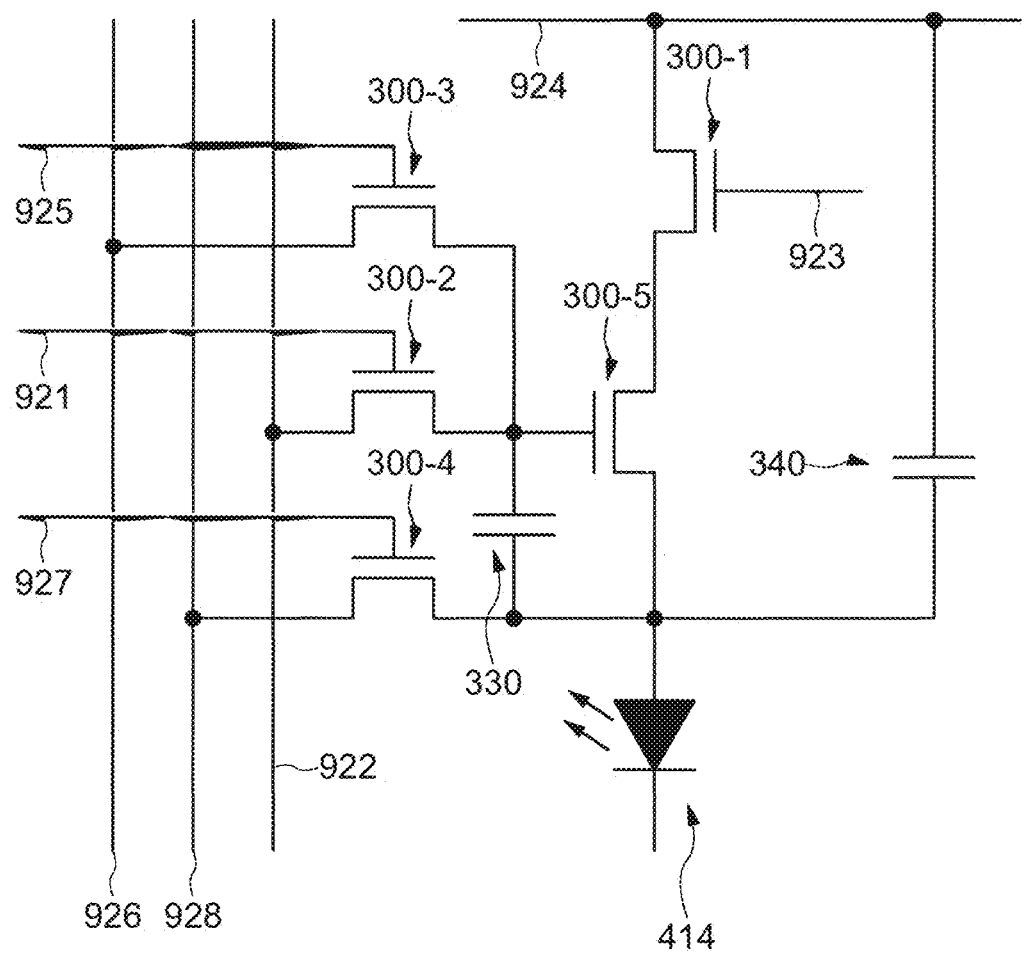
FIG. 11 is a circuit diagram of a pixel circuit in a pixel of a display device according to an embodiment of the present invention.

Referring to FIGS. 9 to 11, a display device according to an embodiment of the present invention is described. In the description of the display device 20, the same structures as those of the display device 10 are omitted, and structures different from those of the display device 10 are mainly described.

FIG. 9 is a cross-sectional view of a display region of the display device 20 according to the embodiment of the present invention.

As shown in FIG. 9, the display device 20 includes the first substrate 202, the light-shielding layer 204, the first insulating layer 206, the semiconductor layer 208, the second insulating layer 210, the first conductive layer 212, the third insulating layer 214, the second conductive layer 216, the fourth insulating layer 218, the first organic resin layer 220-1, the second organic resin layer 220-2, the fifth insulating layer 230, a first electrode layer 410, a connection electrode layer 412, a red LED chip 414R, a green LED chip 414G, a blue LED chip 414B, a third organic resin layer 420-1, a fourth organic resin layer 420-2, and a second electrode layer 430.

In FIG. 9, a red pixel 110R, a green pixel 110G, and a blue pixels 110B are shown as the plurality of pixels 110. Each of the red pixel 110R, the green pixel 110G, and the blue pixel 110B includes a transistor 300 that controls the pixel 110.

The first electrode layer 410 is provided on the first substrate 202 side and can function as an electrode for electrically connecting to the LED chip 414. The first electrode layer 410 is electrically connected to the transistor 300. As a material of the first electrode layer 410, for example, a metal such as aluminum (Al), titanium (Ti), molybdenum (Mo), copper (Cu), or tungsten (W), or an alloy thereof can be used. Further, as the material of the first electrode layer 410, for example, a transparent conductive oxide such as indium tin oxide (ITO), zinc oxide (ZnO), or zinc oxide (IZO) can be used. Furthermore, the first electrode layer 410 may have a stacked structure of the metal and the transparent conductive oxide. Moreover, the first electrode layer 410 may have a stacked structure made of a plurality of metals.

The connection electrode layer 412 can fix the LED chip 414 to the first electrode layer 410 and electrically connect the LED chip 414 and the first electrode layer 410. The connection electrode layer 412 is, for example, a conductive adhesive such as silver paste or solder. An anisotropic conductive film (ACF) can also be used as the connection electrode layer 412.

The red LED chip 414R, the green LED chip 414G, and the blue LED chip 414B are arranged in the red pixel 110R, the green pixel 110G, and the blue pixel 110B, respectively. By controlling light emissions from the red LED chip 414R, the green LED chip 414G, and the blue LED chip 414B, the display device 20 can obtain a full-color display.

The LED chip 414 shown in FIG. 9 has a vertical LED structure (vertical electrode structure) and is electrically connected to the first electrode layer 410 and the second electrode layer 430. However, the structure of the LED chip 414 is not limited thereto. The LED chip 414 may have a horizontal LED structure (horizontal electrode structure). The LED chip 414 emits light toward the second electrode layer 430 side.

The second electrode layer 430 is provided on the planarization layer 420 and can be electrically connected to the LED chip 414. Since the light emitted from the LED chip 414 is extracted through the second electrode layer 430, the second electrode layer 430 is preferably a conductive material having high light transmittance. As a material of the second electrode layer 430, for example, a transparent conductive oxide such as indium tin oxide (ITO), zinc oxide (ZnO), or zinc oxide (IZO) can be used.

The third organic resin layer 420-1 and the fourth organic resin layer 420-2 are planarization layer 420 having a so-called stacked structure. That is, the third organic resin layer 420-1 and the fourth organic resin layer 420-2 can cover the first electrode layer 410. Further, the second electrode layer 420 is isolated from the first electrode layer 410 by the third organic resin layer 420-1 and the fourth organic resin layer 420-2. As materials of the third organic resin layer 420-1 and the fourth organic resin layer 420-2, for example, a photosensitive organic material such as photosensitive acrylic or photosensitive polyimide can be used.

In the embodiment, the fourth organic resin layer 420-2 having properties different from those of the third organic resin layer 420-1 is provided on the first organic resin layer 420-1. The stacked structure of the third organic resin layer 420-1 and the fourth organic layer 420-2 can have excellent functions as the planarization layer 420.

Referring to FIGS. 10A to 10C, details of the stacked structure of the third organic resin layer 420-1 and the fourth organic resin layer 420-2 and their functions are described.

FIG. 10A is an enlarged view of a region in which the LED chip 414 is mounted in the display device 20 according to the embodiment of the present invention.

The LED chip 414 is mounted on the first electrode layer 410 via the connection electrode layer 412. A planarization layer 420 is provided on a side surface of the LED chip 414. However, an upper surface of the LED chip 414 is exposed from the planarization layer 420. The second electrode layer 430 is provided on the upper surface of the LED chip 414 and the planarization layer 420.

The planarization layer 420 includes the third organic resin layer 420-1 and the fourth organic resin layer 420-2. A film thickness of each of the third organic resin layer 420-1 and the fourth organic resin layer 420-2 can be determined according to the properties or functions required by the display device 20. For example, when a fourth relative dielectric constant of the fourth organic resin layer 420-2 is larger than a third relative dielectric constant of the third organic resin layer 420-1, the film thickness of the fourth organic resin layer 420-2 can be smaller than the film thickness of the third organic resin layer 420-1. Typically, the ratio of the film thickness of the fourth organic resin layer 420-2 to the film thickness of the third organic resin layer 420-1 is greater than or equal to 0.2 and less than or equal to 1.0.

Further, for example, when a heat resistance of the third organic resin layer 420-1 is superior to a heat resistance of the fourth organic resin layer 420-2, an interface between the third organic resin layer 420-1 and the fourth organic resin layer 420-2 is preferably located over an active layer 414a of the LED chip 414 (on the second electrode layer 430 side of the active layer 414a). Most of the heat generated by the LED chip 414 occurs in the active layer 414a. Therefore, the heat resistance of the display device 20 can be improved by arranging the third organic resin layer 420-1 having excellent heat resistance in the vicinity of the active layer 414a. Further, when a moisture permeability of the third organic resin layer 420-1 is superior to a moisture permeability of the fourth organic resin layer 420-2 (that is, when the third organic resin layer 420-1 has a lower moisture permeability than the fourth organic resin layer 420-2), the interface between the third organic resin layer 420-1 and the fourth organic resin layer 420-2 is preferably located over the active layer 414a of the LED chip 414. Since it is possible to prevent water from entering the active layer 414a, the reliability of the display device 20 can be improved.

When the relative dielectric constant of the photosensitive organic material is large, heat resistance and moisture permeability are excellent. Therefore, each of the photosensitive organic materials is preferably selected so that the third relative dielectric constant of the third organic resin layer 420-1 is larger than the fourth relative dielectric constant of the fourth organic resin layer 420-2. For example, the third relative dielectric constant of the third organic resin layer 420-1 is greater than or equal to 3.5 and less than 5.0, and the fourth relative dielectric constant of the fourth organic resin layer 220-2 is greater than or equal to 2.0 and less than 3.5.

The upper surface of the LED chip 414 is larger than that of the lower surface, and the side surface of the LED chip 414 is inclined from the lower surface toward the upper surface. That is, the side surface of the LED chip 414 has a so-called reverse taper shape. When the third organic resin layer 420-1 and the fourth organic resin layer 420-2 are formed between the LED chips 414 having the inverted taper shape, each of ends of the third organic resin layer 420-1 and the fourth organic resin layer 420-2 includes a convex shape inclined upward in the vicinity of the side surface of the LED chip 414. The convex shape of each of the end portions of the third organic resin layer 420-1 and the fourth organic resin layer 420-2 is formed when the third organic resin layer 420-1 and the fourth organic resin layer 420-2 are reflowed.

As shown in FIG. 10A, in the planarization layer 420, a height of a first convex shape 450-1 at the end portion of the third organic resin layer 420-1 and a second convex shape 450-2 at the end portion of the fourth organic resin layer 420-2 are formed to be different. In the following, the height of the first convex shape 450-1 and the height of the second convex shape 450-2 are described with reference to FIGS. 10B and 10C.

FIGS. 10B and 10C are an enlarged view of the vicinity of the end portion of the third organic resin layer 420-1 and an enlarged view of the vicinity of the end portion of the fourth organic resin layer 420-2 in the display device 20 according to the embodiment of the present invention.

As shown in FIG. 10B, a height T1 of the first convex shape 450-1 is a height from a flat portion of a boundary surface in which the third organic resin layer 420-1 is in contact with the fourth organic resin layer 420-2 (for example, the flat portion may be substantially parallel to the surface of the first substrate 202 shown in FIG. 9.) to an end portion of the boundary surface in which the third organic resin layer 420-1 is in contact with the LED chip 414. Similarly, as shown in FIG. 10C, a height T2 of the second convex shape 450-2 is a height from a flat portion of a boundary surface in which the fourth organic resin layer 420-2 is in contact with the second electrode 430 (for example, the flat portion may be substantially parallel to the surface of the first substrate 202 shown in FIG. 9.) to an end portion of the boundary surface in which the fourth organic resin layer 420-2 is in contact with the LED chip 414.

In the display device 20, the height T2 of the second convex shape 450-2 at the end portion of the fourth organic resin layer 420-2 is preferably larger than the height T1 of the first convex shape 450-1 at the end portion of the third organic resin layer 420-1. In other words, it can be said that it is preferable that the end portion of the fourth organic resin layer 420-2 has a steeper slope than the end portion of the third organic resin layer 420-1. When the second convex shape 450-2 at the end portion of the fourth organic resin layer 420-2 is large, a step between the upper surface of the LED chip 414 and the planarization layer 420 becomes smaller in the vicinity of the upper surface the end portion of the LED chip 414. Therefore, defects due to disconnection of the second electrode layer 430 formed on the upper surface of the LED chip 414 and the planarization layer 420 can be suppressed, and the reliability of the display device 20 can be improved.

Further, the third organic resin layer 420-1 and the fourth organic resin layer 420-2 shrink by reflowing the third organic resin layer 420-1 and the fourth organic resin layer 420-2. Since the shrunk third organic resin layer 420-1 and the fourth organic resin layer 420-2 pull the LED chip 414 toward the first electrode layer 410, an adhesion between the LED chip 414 and the first electrode layer 410 can be improved.

Referring to FIG. 11, a control of the pixel 110 of the display device 20 is described.

FIG. 11 is a circuit diagram of the pixel circuit in the pixel 110 of the display device 20 according to the embodiment of the present invention.

As shown in FIG. 11, the pixel circuit of the pixel 110 includes the LED chip 414, a first transistor 300-1, a second transistor 300-2, a third transistor 300-3, a fourth transistor 300-4, a fifth transistor 300-5, a first capacitance element 330, and a second capacitance element 340. Further, the pixel circuit of the pixel 110 includes a scan line 921, a signal line 922, a light emission control scan line 923, a current supply line 924, an initialization scan line 925, an initialization line 926, a reset scan line 927, and a reset line 928.

The first transistor 300-1 is a light emission control transistor. The first transistor 300-1 is opened and closed by the light emission control scanning line 923, and selects whether or not to flow a current to the LED chip 414 and the fifth transistor 300-5.

The second transistor 300-2 is a selection transistor. The second transistor 300-2 is opened and closed by the scanning line 921, and applies a voltage supplied by the signal line 922 to a gate of the fifth transistor 300-5.

The third transistor 300-3 is an initialization transistor. The third transistor 300-3 is opened and closed by the initialization scanning line 925, and fixes the gate of the fifth transistor 300-5 to a predetermined potential by using a voltage supplied by the initialization line 926.

The fourth transistor 300-4 is a reset transistor. The fourth transistor 300-4 is opened and closed by the reset scanning line 927, and applies a reverse bias voltage supplied by the reset line 928 to the LED chip 414.

The fifth transistor 300-5 is a drive transistor. As described above, the fifth transistor 300-5 has the gate potential determined based on the operation of the second transistor 300-2 or the third transistor 300-3, and supplies a value determined current based on the gate potential from the current supply line 924 to the LED chip 414.

The current supply line 924 is electrically connected to the power supply. However, when the current flowing through the current supply line 924 changes suddenly, an induced voltage is generated due to the change in the current, and the voltage of the power supply fluctuates. Therefore, in general, a decoupling capacitor is provided between the current supply line 924 and the ground line to stabilize the voltage of the power supply.

In the case of the display device 20 according to the embodiment, the planarization layer 420 can include the third organic resin layer 420-1 having the large relative dielectric constant. Therefore, by covering the current supply line 924 with the third organic resin layer 420-1, the decoupling capacity can be increased and the voltage of the power supply can be stabilized.

As described above, in the display device 20 according to the embodiment, the planarization layer between the LED chips 414 has a stacked structure in which the fourth organic resin layer 420-2 is provided on the third organic resin layer 420-1. For the planarization layer 420, the third organic resin layer 420-1 and the fourth organic resin layer 420-2 can be selected according to the structure or shape of the LED chip 414. For example, by stacking the fourth organic resin layer 420-2 having a large convex shape at the end portion after the reflow process on third organic resin layer 420-1 having excellent heat resistance, the heat resistance and reliability of the display device 20 can be improved. In particular, when the third relative dielectric constant of the third organic resin layer 420-1 is larger than the fourth relative dielectric constant of the fourth organic resin layer 420-2, and the film thickness of the third organic resin layer 420-1 is larger than the film thickness of the fourth organic resin layer 420-2, the effect becomes large.

<First Modification>

Figure 12:
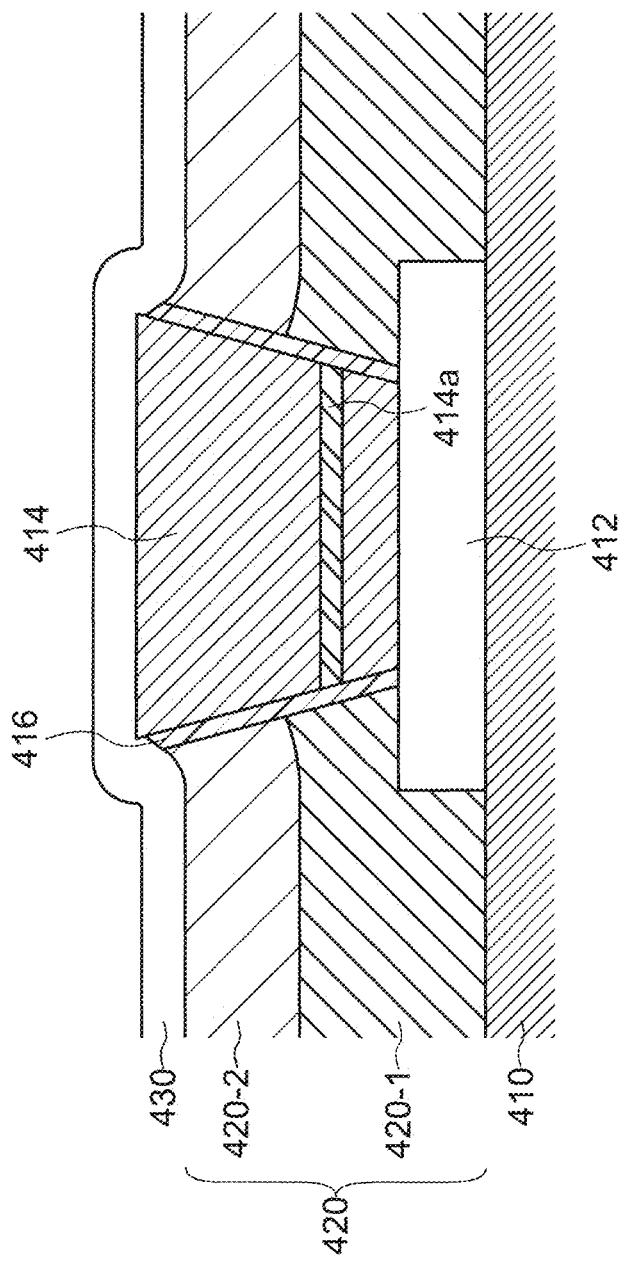
FIG. 12 is an enlarged view of a region in which an LED chip is mounted in a display device according to an embodiment of the present invention.

Referring to FIG. 12, a modified example of the display device 20 is described. In the following, the same structures as those of the display device 20 described above are omitted.

FIG. 12 is an enlarged view of a region in which the LED chip 414 is mounted in the display device 20 according to the embodiment of the present invention.

In the display device 20 shown in FIG. 12, a sixth insulating layer 416 is provided on the side surface of the LED chip 414. The sixth insulating layer 416 can function as a protective layer for the LED chip 414. As a material of the sixth insulating layer 416, for example, silicon oxide, silicon nitride, aluminum oxide, aluminum nitride, or the like can be used. Further, the sixth insulating layer 416 can be a single layer or a stacked layer.

The above structure in the display device 20 can be manufactured, for example, by the following steps. The sixth insulating layer 416 is formed on the side surface of the LED chip 414, and the LED chip on which the sixth insulating layer 416 is formed is mounted on the connection electrode layer 412. The third organic resin layer 420-1 and the fourth organic resin layer 420-2 are sequentially formed by coating or the like.

In the display device 20 according to the First Modification, since the sixth insulating layer 416 is provided on the side surface of the LED chip 414, it is possible to prevent moisture from entering the active layer 414a. Therefore, the reliability of the display device 20 can be further improved. Further, by providing the sixth insulating layer 416, a step between the upper surface of the LED chip 414 and the planarization layer 420 can be reduced in the vicinity of the upper surface the end portion of the LED chip 414. Therefore, defects due to disconnection of the second electrode layer 430 formed on the upper surface of the LED chip 414 and the planarization layer 420 can be suppressed, and the reliability of the display device 20 can be improved.

<Second Modification>

Figure 13:
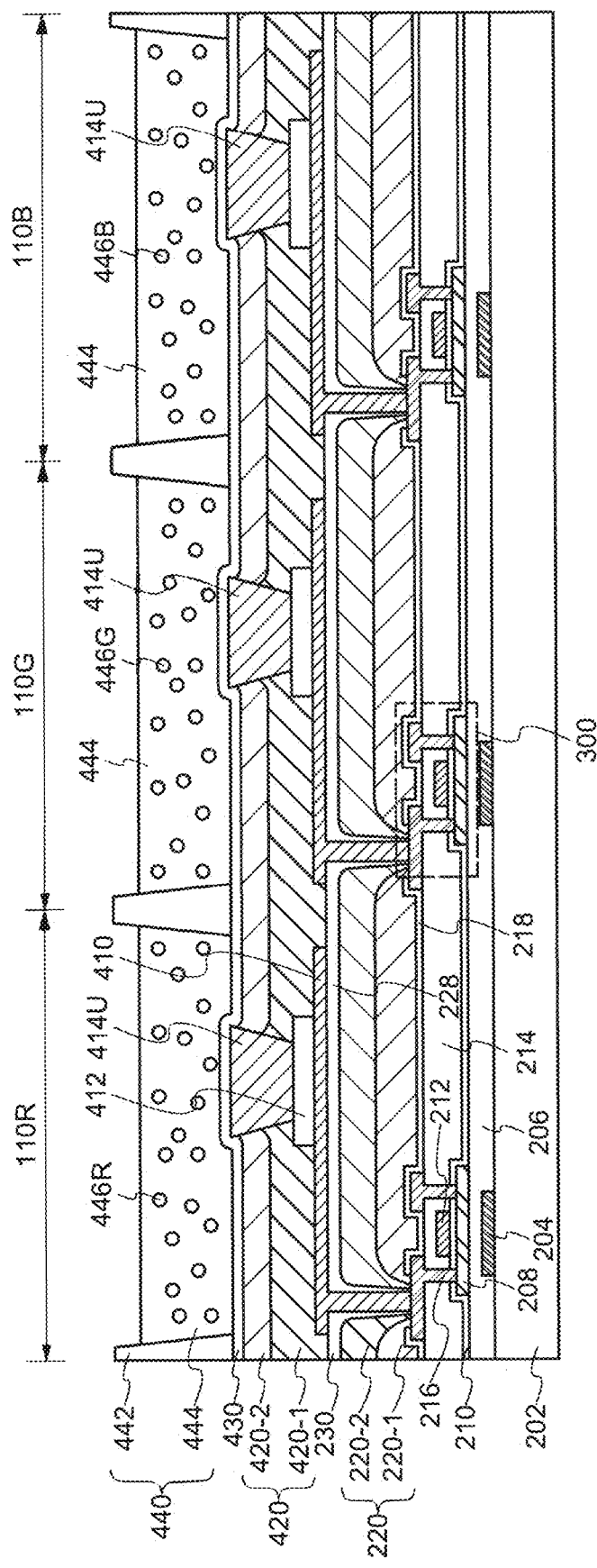
FIG. 13 is a cross-sectional view of a display region of a display device according to an embodiment of the present invention.

Referring to FIG. 13, another modified example of the display device 20 is described. In the following, the same structures as those of the display device 20 described above are omitted.

FIG. 13 is a cross-sectional view of a display region of the display device 20 according to the embodiment of the present invention.

As shown in FIG. 13, the display device 20 includes the first substrate 202, the light-shielding layer 204, the first insulating layer 206, the semiconductor layer 208, the second insulating layer 210, the first conductive layer 212, the third insulating layer 214, and the second conductive layer 216, the fourth insulating layer 218, the first organic resin layer 220-1, the second organic resin layer 220-2, the fifth insulating layer 230, the first electrode layer 410, the connection electrode layer 412, a ultraviolet LED chip 414U, the third organic resin layer 420-1, the fourth organic resin layer 420-2, the second electrode layer 430, and a conversion layer 440. The conversion layer 440 is provided on the second electrode layer 430.

In FIG. 13, a red pixel 110R, a green pixel 110G, and a blue pixel 110B are shown as the plurality of pixels 110. Each of the red pixel 110R, the green pixel 110G, and the blue pixel 110B includes the transistor 300 that controls the pixel 110. Further, each of the red pixel 110R, the green pixel 110G, and the blue pixel 110B includes the ultraviolet LED chip 414U and the conversion layer 440.

The ultraviolet LED chip 414U emits ultraviolet light. A wavelength of ultraviolet light is, for example, greater than or equal to 300 nm and less than or equal to 380 nm. When the wavelength of the ultraviolet light of the ultraviolet LED chip 414U is smaller than the above range, the energy of the ultraviolet light is large, so that the layers or regions included in the display device 20 are damaged by the ultraviolet light. Further, when the wavelength of the ultraviolet light is larger than the above range, the ultraviolet light is less likely to be absorbed by a phosphor 446. Therefore, the wavelength of ultraviolet light is preferably in the above range.

The conversion layer 440 includes a bank 442, a binder resin 444, and a phosphor 446. Each pixel 110 is separated by the bank 442. The red pixel 110R contains the binder resin 444 and a red phosphor 446R, the green pixel 110G contains the binder resin 444 and a green phosphor 446G, and the blue pixel 110B contains the binder resin 444 and a blue phosphor 446B.

The bank 442 need only be able to separate the pixels 110 from each other, and is preferably black. That is, the bank 442 can function as a black matrix.

The binder resin 444 has translucency and can disperse the phosphor 446. As a material of the binder resin 444, for example, an organic resin material such as an epoxy resin, a silicone resin, a phenol resin, or a polyimide resin can be used. Further, as the material of the binder resin 444, an inorganic material such as glass can also be used.

The red phosphor 446R can absorb the ultraviolet light emitted from the ultraviolet LED chip, convert the wavelength of the ultraviolet light into the wavelength of the red light, and emit the light. The green phosphor 446G can absorb the ultraviolet light emitted from the ultraviolet LED chip, convert the wavelength of the ultraviolet light into the wavelength of the green light, and emit the light. The blue phosphor 446B can absorb the ultraviolet light emitted from the ultraviolet LED chip, convert the wavelength of the ultraviolet light into the wavelength of the blue light, and emit the light. That is, the red pixel 110R emits the red light converted by the red phosphor 446R, the green pixel 110G emits the green light converted by the green phosphor 446G, and the blue pixel 110B emits the blue light converted by the blue phosphor 446B. In the display device 20, full-color display is possible by the red light, green light, and blue light converted by the conversion layer 440.

As the red phosphor 446R, for example, a phosphor containing $Eu^{3+}$ ion ($Sr_2Si_7Al_3ON_{13}$:Eu, $La_2O_2S$:Eu, etc.) can be used. As the green phosphor 446G, for example, a phosphor containing $Eu^{2+}$ ion or $Mn^{2+}$ ion ($Sr_3Si_{13}Al_3O_2N_{21}$:Eu, $(Ba,Sr,Mg)_2SiO_4$:Eu,Mn, or $3(Ba,Mg)O.8Al_2O_3$:Eu,Mn, etc.) can be used. As the blue phosphor 446B, for example, a phosphor containing $Eu^{2+}$ ions ($Sr_{10}(PO_4)_6Cl_2$:Eu or $(Sr,Ba,Ca)_{10}(PO_4)_6Cl_2$:Eu, etc.) can be used.

The red phosphor 446R, the green phosphor 446G, and the blue phosphor 446B may be quantum dots. As the quantum dots, for example, semiconductor fine particles having a diameter of greater than or equal to 0.5 nm and less than or equal to 20 nm can be used.

In the display device 20 according to the Second Modification, the ultraviolet LED chip 414U is used. Therefore, each layer or region of the display device 20 may be damaged by ultraviolet light. In particular, the planarization layer 420 between the ultraviolet LED chips 414U is significantly affected by ultraviolet light. Therefore, in the display device 20 according to the Second Modification, a photosensitive organic material that is not easily affected by ultraviolet light is used for the third organic resin layer 420-1. Further, the film thickness of the third organic resin layer 420-1 is preferably larger than the film thickness of the fourth organic resin layer 420-2. With such a structure, the planarization layer 420 has a high proportion of the third organic resin layer 420-1, which is resistant to ultraviolet light, so that the reliability of the planarization layer 420 can be improved. Further, since the fourth organic resin layer 420-2 is made of a photosensitive organic material having a large convex shape at the end portion after reflow process, defects due to disconnection of the second electrode layer 430 can be suppressed. Therefore, the reliability of the display device 20 according to the Second Modification can be improved. In particular, when the third relative dielectric constant of the third organic resin layer 420-1 is larger than the fourth relative dielectric constant of the fourth organic resin layer 420-2, and the film thickness of the third organic resin layer 420-1 is larger than the film thickness of the fourth organic resin layer 420-2, the effect becomes large.

<Third Modification>

Figure 14:
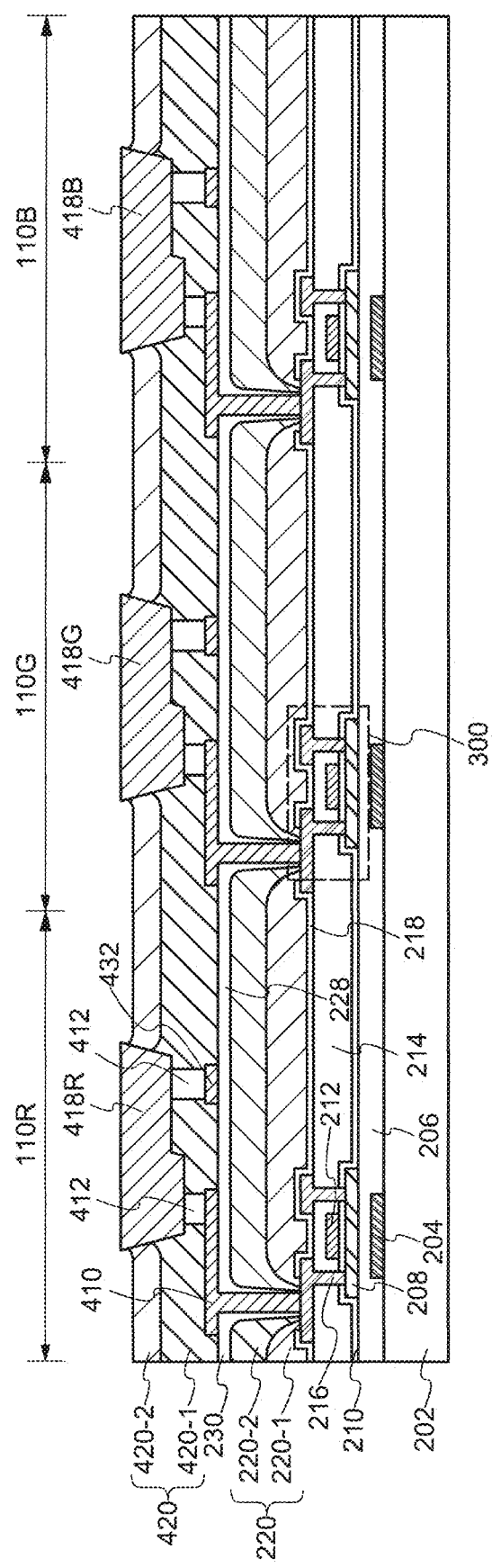
FIG. 14 is a cross-sectional view of a display region of a display device according to an embodiment of the present invention.

Referring to FIG. 14, a further modified example of the display device 20 is described. In the following, the same structures as those of the display device described above are omitted.

FIG. 14 is a cross-sectional view of the display region of the display device 20 according to the embodiment of the present invention.

As shown in FIG. 14, the display device 20 according to the Third Modification includes the first substrate 202, the light-shielding layer 204, the first insulating layer 206, the semiconductor layer 208, the second insulating layer 210, the first conductive layer 212, the third insulating layer 214, the second conductive layer 216, the fourth insulating layer 218, the first organic resin layer 220-1, the second organic resin layer 220-2, the fifth insulating layer 230, the first electrode layer 410, the second electrode layer 432, the connection electrode layer 412, a red LED chip 418R, a green LED chip 418G, a blue LED chip 418B, the third organic resin layer 420-1, and the fourth organic resin layer 420-2 are included. The first electrode layer 410 and the second electrode layer 432 are provided in contact with the fifth insulating layer 230.

In FIG. 14, a red pixel 110R, a green pixel 110G, and a blue pixel 110B are shown as the plurality of pixels 110. Each of the red pixel 110R, the green pixel 110G, and the blue pixel 110B includes the transistor 300 that controls the pixel 110.

The red LED chip 418R, the green LED chip 418G, and the blue LED chip 418B are arranged in the red pixel 110R, the green pixel 110G, and the blue pixel 110B, respectively. By controlling the light emissions from the red LED chip 414R, the green LED chip 414G, and the blue LED chip 414B, the display device 20 can obtain a full-color display.

In the display device 20 according to the Third Modification, the LED chip 418 is provided on the first electrode layer 410 and the second electrode layer 432 via the connection electrode layer 412. The LED chip 418 has a horizontal LED structure (horizontal electrode structure), and is mounted on the first electrode layer 410 and the second electrode layer 432 by a so-called flip chip. Also in this case, the third organic resin layer 420-1 having excellent heat resistance can be provided in the vicinity of the active layer of the LED chip 418. Therefore, the heat resistance and reliability of the display device 20 according to the Third Modification can be improved. In particular, when the third relative dielectric constant of the third organic resin layer 420-1 is larger than the fourth relative dielectric constant of the fourth organic resin layer 420-2, and the film thickness of the third organic resin layer 420-1 is larger than the film thickness of the fourth organic resin layer 420-2, the effect becomes large.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A display device comprising:
   a first electrode layer;
   an LED chip electrically connected to the first electrode layer;
   a first organic resin layer covering the first electrode layer; and
   a second organic resin layer over the first organic resin layer,
   wherein an end portion of the first organic resin layer comprises a first convex shape in a vicinity of a side surface of the LED chip,
   wherein an end portion of the second organic resin layer comprises a second convex shape in the vicinity of the side surface of the LED chip, and
   wherein a height of the second convex shape is greater than a height of the first convex shape.

2. The display device according to claim 1, wherein a ratio of a film thickness of the second organic resin layer to a film thickness of the first organic resin layer is greater than or equal to 0.2 and less than or equal to 1.0.

3. The display device according to claim 1, wherein a first relative dielectric constant of the first organic resin layer is greater than a second relative dielectric constant of the second organic resin layer.

4. The display device according to claim 3, wherein the first relative dielectric constant of the first organic resin layer is greater than or equal to 3.5 and less than 5.0.

5. The display device according to claim 3, wherein the second relative dielectric constant of the second organic resin layer is greater than or equal to 2.0 and less than 3.5.

6. The display device according to claim 1, further comprising a second electrode layer over the LED chip and the second organic resin layer.

7. The display device according to claim 1, wherein an interface between the first organic resin layer and the second organic resin layer is provided over an active layer of the LED chip.

8. The display device according to claim 1, wherein the LED chip is any one of a red LED chip, a green LED chip, and a blue LED chip.

9. The display device according to claim 1, wherein the LED chip is an ultraviolet LED chip.

* * * * *